US012320860B2

United States Patent
Suzuki et al.

(10) Patent No.: US 12,320,860 B2
(45) Date of Patent: Jun. 3, 2025

(54) DETERIORATION DIAGNOSIS APPARATUS OF ASSEMBLED BATTERY AND DETERIORATION DIAGNOSIS METHOD OF ASSEMBLED BATTERY

(71) Applicant: TOYOTA JIDOSHA KABUSHIKI KAISHA, Toyota (JP)

(72) Inventors: Kentaro Suzuki, Kariya (JP); Koji Yamada, Kusatsu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 417 days.

(21) Appl. No.: 17/893,321

(22) Filed: Aug. 23, 2022

(65) Prior Publication Data

US 2023/0137917 A1 May 4, 2023

(30) Foreign Application Priority Data

Nov. 1, 2021 (JP) ................. 2021-178695

(51) Int. Cl.
*G01R 31/392* (2019.01)
*G01R 31/396* (2019.01)
(Continued)

(52) U.S. Cl.
CPC ......... *G01R 31/392* (2019.01); *G01R 31/396* (2019.01); *H01M 10/441* (2013.01); *H02J 7/007182* (2020.01)

(58) Field of Classification Search
CPC .... H02J 7/0048; H02J 7/005; H02J 7/007182; H01M 10/441; H01M 10/48;
(Continued)

(56) References Cited

U.S. PATENT DOCUMENTS 6,061,639 A * 5/2000 Wistrand ............. G01R 31/396
340/636.15
6,157,169 A * 12/2000 Lee .................. G01R 19/16542
320/132
(Continued)

FOREIGN PATENT DOCUMENTS

| JP | 2013-110906 A | 6/2013 |
| JP | 2019-113414 A | 7/2019 |
| JP | 2020-038812 A | 3/2020 |

OTHER PUBLICATIONS

Istardi et al., The Weakest Cell Identification in Li—Ion battery packs using Discharging Technique Performance, IEEE, 2018 (Year: 2018).*

(Continued)

*Primary Examiner* — Kyle R Quigley
(74) *Attorney, Agent, or Firm* — Dinsmore & Shohl LLP

(57) ABSTRACT

A deterioration diagnosis apparatus of an assembled battery includes at least one processor. The at least one processor executes discharging of each of a plurality of cells included in the assembled battery, measures a voltage of each of the cells during the discharging, ends the discharging at a predetermined discharging end timing, and estimates a deterioration degree of the assembled battery using voltage data indicating a transition of a voltage of at least one of the cells from a discharging start voltage to a predetermined discharging end voltage. When the voltage of at least one of the cells reaches the discharging end voltage, the at least one processor decides the discharging end timing using the voltage data of the cell of which the voltage reaches the discharging end voltage.

9 Claims, 12 Drawing Sheets

(51) Int. Cl.
*H01M 10/44* (2006.01)
*H02J 7/00* (2006.01)

(58) Field of Classification Search
CPC ............ H01M 10/482; H01M 2220/20; G01R 31/3835; G01R 31/392; G01R 31/396
See application file for complete search history.

(56) References Cited

U.S. PATENT DOCUMENTS

| | | | | |
|---|---|---|---|---|
| 2003/0030442 | A1* | 2/2003 | Sugimoto | H02J 7/0048 320/136 |
| 2010/0194339 | A1* | 8/2010 | Yang | H02J 7/0016 320/116 |
| 2011/0011653 | A1* | 1/2011 | Mizutani | H02J 7/0016 320/118 |
| 2012/0293129 | A1* | 11/2012 | Naghshtabrizi | H02J 7/0048 320/118 |
| 2013/0338867 | A1* | 12/2013 | Sato | B60W 20/13 903/903 |
| 2014/0265554 | A1* | 9/2014 | Yang | B60L 3/0046 307/9.1 |
| 2015/0212163 | A1* | 7/2015 | Nomura | G01R 31/3648 702/63 |
| 2015/0318721 | A1* | 11/2015 | Watanabe | H02J 7/0048 320/118 |
| 2015/0349551 | A1* | 12/2015 | White | H01M 10/441 320/112 |
| 2023/0314516 | A1* | 10/2023 | Lee | H02J 7/0048 320/132 |

OTHER PUBLICATIONS

Omariba et al., Review of Battery Cell Balancing Methodologies for Optimizing Battery Pack Performance in Electric Vehicles, IEEE, Sep. 12, 2019 (Year: 2019).*

Pascoe et al., VRLA Battery Discharge Reserve Time Estimation, IEEE, 2004 (Year: 2004).*

* cited by examiner

DETERIORATION DIAGNOSIS APPARATUS OF ASSEMBLED BATTERY AND DETERIORATION DIAGNOSIS METHOD OF ASSEMBLED BATTERY

CROSS-REFERENCE TO RELATED APPLICATION

This application claims priority to Japanese Patent Application No. 2021-178695 filed on Nov. 1, 2021, incorporated herein by reference in its entirety.

BACKGROUND

1. Technical Field

The present disclosure relates to a deterioration diagnosis apparatus of an assembled battery and a deterioration diagnosis method of an assembled battery.

2. Description of Related Art

An assembled battery includes a plurality of secondary batteries electrically connected to each other. By combining the secondary batteries, a large-capacity assembled battery can be obtained. However, a full charge capacity (an electricity amount accumulated in the secondary battery at a time of full charging) of a secondary battery decreases as the secondary battery deteriorates. A life of the assembled battery is often determined by a deterioration degree of a secondary battery (hereinafter, also referred to as a "minimum capacity cell") having the smallest full charge capacity from among secondary batteries (hereinafter, also referred to as "cells") composing the assembled battery. For this reason, a deterioration degree of the assembled battery can be estimated from data of the minimum capacity cell. For example, Japanese Unexamined Patent Application Publication No. 2020-38812 (JP 2020-38812 A) discloses a method of diagnosing a deterioration degree of an assembled battery using a transition of a voltage of a minimum capacity cell during discharging. In this method, the discharging of each of cells composing the assembled battery is executed, and a cell of which a voltage reaches a discharging lower limit voltage (a lower limit voltage indicating that a cell reaches over-discharging when the discharging is continued longer than the lower limit voltage) earliest during the discharging is regarded as the minimum capacity cell.

SUMMARY

In the technique described in JP 2020-38812 A, the cell of which the voltage reaches the discharging lower limit voltage earliest during the discharging is regarded as the minimum capacity cell, and discharging data (a transition of the voltage during the discharging) of only one cell is measured. However, the cell of which the voltage reaches the discharging lower limit voltage earliest during the discharging is not always the minimum capacity cell. For example, when voltage variations exist between cells at a start of the discharging, the lower a voltage of a cell at the start of the discharging, the easier the cell voltage early reaches the discharging lower limit voltage. As such, a voltage of a cell other than the minimum capacity cell may reach the discharging lower limit voltage earlier than that of the minimum capacity cell. When the deterioration degree of the assembled battery is estimated from data of the cell other than the minimum capacity cell, the deterioration degree (and thus the life) of the assembled battery may not be correctly diagnosed.

On the other hand, when the discharging is continued until voltages of all the cells included in the assembled battery reach the discharging lower limit voltage, at least one cell may be over-discharged. The over-discharging accelerates deterioration of a cell.

The present disclosure enhances accuracy of deterioration diagnosis of an assembled battery while restricting deterioration of a cell during the diagnosis of the assembled battery.

A deterioration diagnosis apparatus of an assembled battery according to a first aspect of the present disclosure includes at least one processor. The at least one processor is configured to execute discharging of each of a plurality of cells included in the assembled battery, measure a voltage of each of the cells during the discharging, end the discharging at a predetermined discharging end timing, and estimate a deterioration degree of the assembled battery using voltage data indicating a transition of a voltage of at least one of the cells from a discharging start voltage to a predetermined discharging end voltage. The at least one processor is configured to, when the voltage of at least one of the cells reaches the discharging end voltage, decide the discharging end timing using the voltage data of the cell of which the voltage reaches the discharging end voltage.

In the deterioration diagnosis apparatus of the assembled battery, when a voltage of any cell reaches the discharging end voltage of the assembled battery during the discharging, the at least one processor decides the discharging end timing based on the voltage data (a transition of the voltage from the discharging start voltage to the discharging end voltage) of the cell. Hereinafter, a cell of which a voltage reaches the discharging end voltage earliest during the discharging from among the cells included in the assembled battery is referred to as a "target cell". With the above configuration, even when a voltage of a target cell reaches the discharging end voltage, the discharging of the assembled battery is continued until the discharging end timing, which is decided based on the voltage data of the target cell, without stopping the discharging of the assembled battery. It is easy to appropriately decide the discharging end timing using the voltage data of the target cell.

For example, the lower the voltage of the target cell at the start of the discharging, the lower a possibility that the target cell is the minimum capacity cell (the cell having the smallest full charge capacity in the assembled battery). The lower the voltage of the target cell at the start of the discharging, the further the at least one processor may delay the discharging end timing. By doing so, it is easy for the at least one processor to acquire the voltage data of the minimum capacity cell. However, when the discharging is continued for too long, the target cell may deteriorate due to over-discharging. In order to prevent the target cell from excessively deteriorating due to the over-discharging, the at least one processor may decide that the discharging end timing is within a period from the time at which the voltage of the target cell reaches the discharging end voltage to a time when a predetermined time (an allowable time that is set to prevent the over-discharging) elapses. As such, it is easy for the at least one processor to appropriately decide the discharging end timing using the voltage data of the target cell. As such, it is easy to raise accuracy of deterioration diagnosis of an assembled battery while restricting deterioration of a cell during the diagnosis of the assembled battery. A setting mode of the discharging end timing is not limited thereto. Other modes will be described below.

In the first aspect, the at least one processor may be configured to decide the discharging end timing, further using a predetermined voltage of at least one of the cells. The predetermined voltage may correlate with a discharging period of the assembled battery.

It is easy for the at least one processor to determine whether the voltage of the target cell at the start of the discharging is low, using a voltage of each of the cells at the start of the discharging. For example, when the voltage of the target cell is low at the start of the discharging, the possibility that the target cell is the minimum capacity cell is low. For this reason, the at least one processor may continue the discharging within a range in which the target cell does not significantly deteriorate due to the over-discharging. By doing so, it is easy to acquire the voltage data of the minimum capacity cell. On the other hand, when the voltage of the target cell is high at the start of the discharging, the possibility that the target cell is the minimum capacity cell is high. For this reason, the at least one processor may end the discharging immediately after the voltage of the target cell reaches the discharging end voltage. By doing so, it is easy to restrict the deterioration of the cell during the diagnosis of the assembled battery.

In the first aspect, the at least one processor may be configured to determine whether a voltage of a target cell at a start of the discharging corresponds to a maximum cell voltage that is a largest voltage from among voltages of the cells at the start of the discharging. The target cell is the cell of which a voltage reaches the discharging end voltage earliest during the discharging from among the cells. Upon determining that the voltage of the target cell at the start of the discharging does not correspond to the maximum cell voltage, the at least one processor may decide that a timing at which the voltage of the target cell reaches the discharging end voltage when assuming that the discharging of the target cell is started from the maximum cell voltage is the discharging end timing. Upon determining that the voltage of the target cell at the start of the discharging corresponds to the maximum cell voltage, the at least one processor may end the discharging immediately after the voltage of the target cell reaches the discharging end voltage.

When the voltage of the target cell at the start of the discharging corresponds to the maximum cell voltage, the target cell is considered to be the minimum capacity cell. In such a case, it is easy to restrict the deterioration of the cell during the diagnosis of the assembled battery by ending the discharging immediately after the voltage of the target cell reaches the discharging end voltage. On the other hand, when the voltage of the target cell at the start of the discharging does not correspond to the maximum cell voltage, a possibility that the target cell would not be the minimum capacity cell exists. However, when the discharging is continued until the timing at which the voltage of the target cell reaches the discharging end voltage when assuming that the discharging of the target cell is started from the maximum cell voltage, the voltage of the minimum capacity cell is considered to reach the discharging end voltage. With the above configuration, it is easy to estimate, with high accuracy, the deterioration degree of the assembled battery using the voltage data of the minimum capacity cell.

In the first aspect, the at least one processor may be configured to decide that a timing at which a voltage of a target cell reaches the discharging end voltage when assuming that the discharging of the target cell is started from the predetermined voltage is the discharging end timing. The target cell is a cell of which a voltage reaches the discharging end voltage earliest during the discharging from among the cells.

It may be possible to predict a voltage corresponding to the maximum cell voltage by experiments or simulation. The voltage that is predicted as above may be set in the at least one processor. Then, the at least one processor may decide the discharging end timing as above using the set voltage. With the above configuration, it is also possible to enhance the accuracy of the deterioration diagnosis of the assembled battery while restricting deterioration of the cell during the diagnosis of the assembled battery.

In the first aspect, the discharging end voltage may be set based on a discharging lower limit voltage common to the cells. As above, it is easy to restrict the deterioration of the cell during the diagnosis of the assembled battery by setting the discharging end voltage based on the discharging end limit voltage (a lower limit voltage indicating that a cell reaches the over-discharging when the discharging is continued longer than the lower limit voltage). The discharging end voltage may be set such that it matches the discharging lower limit voltage, or may be set such that it is slightly higher than the discharging lower limit voltage.

In the first aspect, all the cells included in the assembled battery may be connected in series. The at least one processor may be configured to maintain a current value of each of the cells during the discharging.

With the above configuration, it is easy to match a current value of each cell included in the assembled battery during the discharging. As such, it is easy to estimate, with the high accuracy, the deterioration degree of the assembled battery.

In the first aspect, the assembled battery may be configured to supply power to a power load mounted on a vehicle. The at least one processor may be configured to execute the discharging by controlling the power load.

With the above configuration, it is possible to easily and appropriately execute the deterioration diagnosis of the assembled battery for the vehicle. The power load controlled by the at least one processor during the discharging may include at least one of air conditioning equipment, a seat heater, and a lighting device.

A deterioration diagnosis apparatus of an assembled battery according to a second aspect of the present disclosure includes at least one processor. At least one processor is configured to execute charging of each of a plurality of cells included in the assembled battery, measure a voltage of each of the cells during the charging, end the charging at a predetermined charging end timing, and estimate a deterioration degree of the assembled battery using voltage data indicating a transition of a voltage of at least one of the cells from a charging start voltage to a predetermined charging end voltage. The at least one processor is configured to, when the voltage of at least one of the cells reaches the charging end voltage, decide the charging end timing using the voltage data of the cell of which the voltage reaches the charging end voltage.

With the deterioration diagnosis apparatus of the assembled battery, it is possible to estimate the deterioration degree of the assembled battery from the transition of the voltage during the charging basically in a mode equivalent to that of the diagnosis of deterioration due to the discharging described above. As such, it is possible to enhance accuracy of the deterioration diagnosis of the assembled battery while restricting the deterioration of the cell during the diagnosis of the assembled battery.

However, the direction of current in the diagnosis of the deterioration due to the discharging is opposite to that in the diagnosis of the deterioration due to the charging. Further, the voltage of each cell decreases during the discharging, and the voltage of each cell increases during the charging. In the diagnosis of the deterioration due to the charging, a cell of which a voltage reaches the charging end voltage earliest during the charging from among the cells included in the assembled battery is referred to as a "target cell". The charging end voltage may be set based on a charging upper limit voltage (an upper limit voltage indicating that a cell reaches over-charging when the charging is continued longer than the upper limit voltage) common to the cells included in the assembled battery. The charging end voltage may be set such that it matches the charging upper limit voltage, or may be set such that it is slightly lower than the charging upper limit voltage.

A deterioration diagnosis method of an assembled battery according to a third aspect of the present disclosure includes executing discharging of each of a plurality of cells while measuring a voltage of each of the cells included in the assembled battery, deciding, when a voltage of any cell reaches a predetermined discharging end voltage during the discharging, a discharging end timing based on voltage data indicating a transition of a voltage of the cell from a discharging start voltage to the discharging end voltage, ending the discharging at the discharging end timing, and estimating a deterioration degree of the assembled battery using voltage data of at least one of the cells that is acquired during the discharging.

In the same manner as in the above-described deterioration diagnosis apparatus due to the discharging, with the deterioration diagnosis method of the assembled battery, it is also possible to enhance accuracy of the deterioration diagnosis of the assembled battery while restricting deterioration of the cell during the diagnosis of the assembled battery.

In the third aspect, the discharging may be executed while the assembled battery is mounted on a vehicle. A full charge capacity of the assembled battery in an initial state may be 5 kWh or smaller.

When the discharging of the assembled battery is executed while it is mounted on the vehicle, rapid discharging is rarely easy. However, when a size of a capacity of the assembled battery to be diagnosed is appropriate, diagnosis with sufficient throughput can be executed using the above-described deterioration diagnosis method due to the discharging. Specifically, when the capacity of the assembled battery is 5 kWh or smaller, the diagnosis with the sufficient throughput can be executed using the above-described deterioration diagnosis method due to the discharging. A full charge capacity of the assembled battery to be diagnosed in the initial state may be 0.1 kWh or larger and 5 kWh or smaller, or may be 0.3 kWh or larger and 3 kWh or smaller. The assembled battery to be diagnosed using the above-described method may be a drive battery mounted on a hybrid electric vehicle (HEV).

A deterioration diagnosis method of an assembled battery according to a fourth aspect of the present disclosure includes executing charging of each of a plurality of cells while measuring a voltage of each of the cells included in the assembled battery, deciding, when a voltage of any cell reaches a predetermined charging end voltage during the charging, a charging end timing based on voltage data indicating a transition of a voltage of the cell from a charging start voltage to the charging end voltage, ending the charging at the charging end timing, and estimating a deterioration degree of the assembled battery using voltage data of at least one of the cells that is acquired during the charging.

In the same manner as in the above-described deterioration diagnosis apparatus due to the charging, with the deterioration diagnosis method of the assembled battery, it is also possible to enhance accuracy of deterioration diagnosis of the assembled battery while restricting deterioration of the cell during the diagnosis of the assembled battery.

In the fourth aspect, the charging may be executed while the assembled battery is mounted on a vehicle. A full charge capacity of the assembled battery in an initial state may be 10 kWh or larger.

When the charging is executed while the assembled battery is mounted on the vehicle, it is relatively easy to raise a charging speed. For example, rapid charging can be executed using electric vehicle supply equipment (EVSE) having a high output. With the above-described deterioration diagnosis method due to the charging, it is possible to diagnose a large-capacity assembled battery (that is, an assembled battery having a capacity of 10 kWh or larger) with sufficient throughput. A full charge capacity of the assembled battery to be diagnosed in an initial state may be 10 kWh or larger and 500 kWh or smaller, or may be 50 kWh or larger and 150 kWh or smaller. The assembled battery to be diagnosed using the above-described method may be a drive battery mounted on a battery electric vehicle (BEV) or a plug-in hybrid electric vehicle (PHEV).

With each aspect of the present disclosure, it is possible to enhance accuracy of deterioration diagnosis of an assembled battery while restricting deterioration of a cell during the diagnosis of the assembled battery.

BRIEF DESCRIPTION OF THE DRAWINGS

Features, advantages, and technical and industrial significance of exemplary embodiments will be described below with reference to the accompanying drawings, in which like signs denote like elements, and wherein.

DETAILED DESCRIPTION OF EMBODIMENTS

Figure 1:
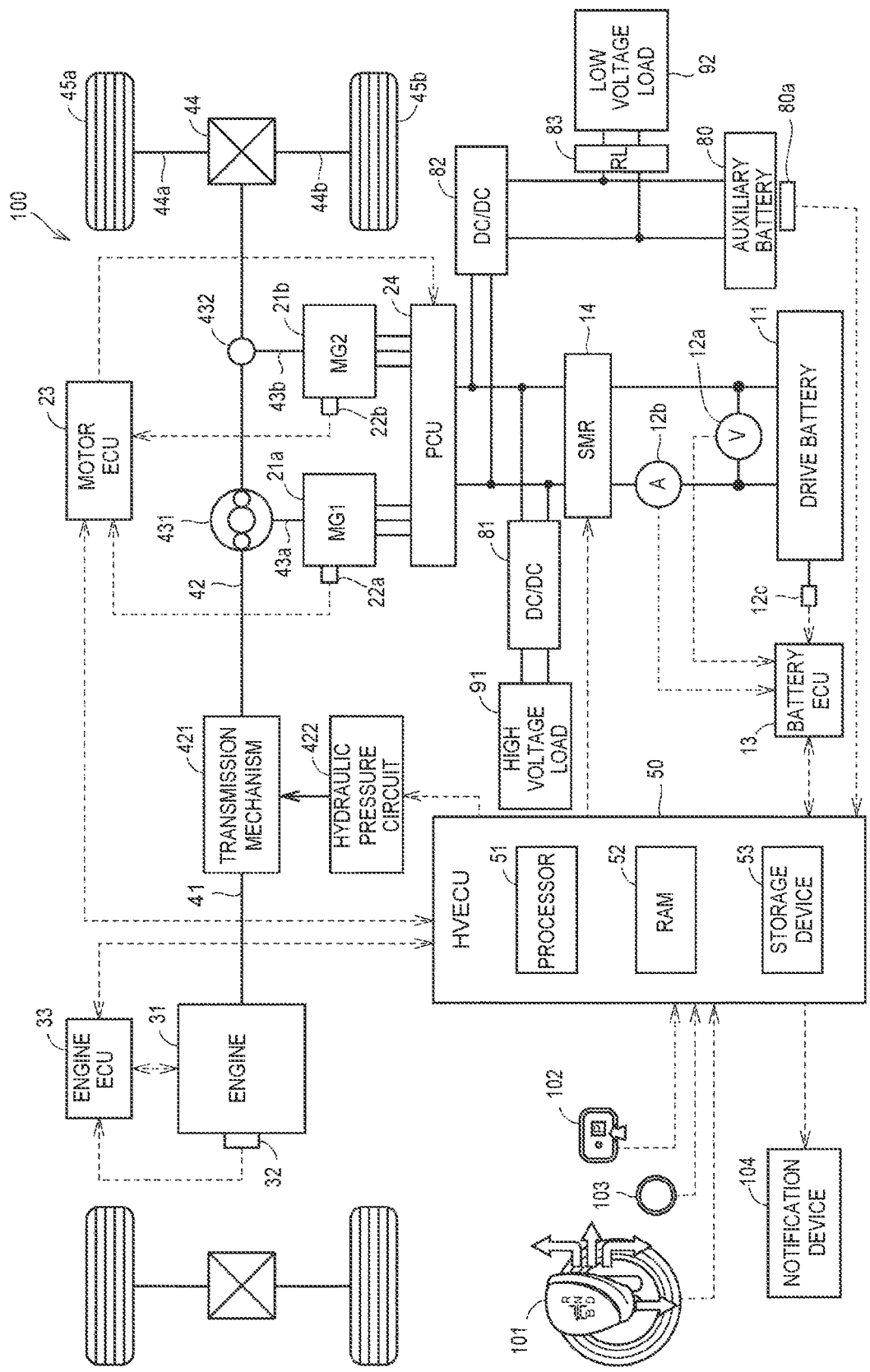
FIG. 1 is a diagram illustrating a configuration of a vehicle according to an embodiment of the present disclosure.

Embodiments of the present disclosure will be described in detail with reference to drawings. In the drawings, the same or corresponding parts are denoted by the same reference signs and the description thereof will not be repeated. Hereinafter, an electronic control unit is also referred to as an "ECU".

FIG. 1 is a diagram illustrating a configuration of a vehicle according to an embodiment. With reference to FIG. 1, a vehicle 100 is a hybrid electric vehicle (HEV). In this embodiment, it is assumed that the vehicle is a front-wheel drive four-wheel vehicle (more specifically, an HEV), but the number of wheels and a drive system can be appropriately changed. For example, the drive system may be four-wheel drive.

The vehicle 100 includes a drive battery 11, a voltage sensor 12a, a current sensor 12b, a temperature sensor 12c, a system main relay (SMR) 14, a first motor generator 21a (hereinafter, referred to as an "MG 21a"), a second motor generator 21b (hereinafter, referred to as an "MG 21b"), a power control unit (PCU) 24, an engine 31, a transmission mechanism 421, and a hydraulic pressure circuit 422.

The drive battery 11 includes a rechargeable secondary battery. The drive battery 11 is configured to supply power to the PCU 24 (and thus the MGs 21a, 21b, which are motors for traveling). In this embodiment, an assembled battery including a plurality of secondary batteries that are electrically connected to each other is employed as the drive battery 11. A full charge capacity of the drive battery 11 in an initial state may be, for example, approximately 1.5 kWh. The secondary batteries included in the drive battery 11 may be modularized by a predetermined number. The assembled battery may be composed by combining a plurality of modules. The number of secondary batteries included in the drive battery 11 may be 10 or more and less than 100, or may be 100 or more. In this embodiment, the number of secondary batteries included in the drive battery 11 is approximately 50. The drive battery 11 is assembled in a form of a battery pack on, for example, a floor panel of the vehicle 100. In this embodiment, the battery pack is formed by installing accessories (a voltage sensor 12a, a current sensor 12b, a temperature sensor 12c, a battery ECU 13, an SMR 14, and the like) in a battery case that accommodates the drive battery 11.

Each secondary battery included in the assembled battery is referred to as a "cell". In this embodiment, all the cells included in the assembled battery are connected in series (see, for example, FIG. 2 described below). In this embodiment, a liquid system lithium-ion secondary battery is employed as a cell. However, examples of the cell are not limited thereto, and an all-solid-state secondary battery may be employed as a cell. Further, examples of the cell are not limited to the lithium-ion secondary battery, and may include other secondary batteries (for example, a nickel-hydrogen battery). Examples of the form of assembling the drive battery 11 in the vehicle 100 are not limited to the battery pack, and may include a packless form.

The voltage sensor 12a detects a voltage of each cell of the drive battery 11. The current sensor 12b detects current flowing through the drive battery 11. The temperature sensor 12c detects a temperature of each cell of the drive battery 11. Each sensor outputs a detection result to the battery ECU 13. The current sensor 12b is provided in a current path of the drive battery 11. In this embodiment, one voltage sensor 12a and one temperature sensor 12c are provided to each cell.

The SMR 14 is configured to switch between connection/disconnection of the current path that connects the PCU 24 to the drive battery 11. As the SMR 14, for example, an electromagnetic mechanical relay can be employed. When the SMR 14 is in a closed state (a connected state), power can be sent and received between the drive battery 11 and the PCU 24. On the other hand, when the SMR 14 is in an open state (a disconnected state), the current path that connects the drive battery 11 to the PCU 24 is disconnected. The SMR 14 is controlled by an HVECU 50. The SMR 14 is switched to the closed state when, for example, the vehicle 100 is traveling.

Each of the MGs 21a and 21b is a motor generator that has both a function as a motor that outputs torque by receiving supply of driving power and a function as a generator that generates generated power by receiving torque. As each of the MGs 21a and 21b, an alternating current motor (for example, a permanent magnet type synchronous motor or an induction motor) is used. Each of the MGs 21a and 21b is electrically connected to the drive battery 11 via the PCU 24. The MGs 21a, 21b have rotor shafts 43a, 43b, respectively. The rotor shafts 43a, 43b correspond to rotation shafts of the MGs 21a, 21b, respectively.

The vehicle 100 further includes a single pinion type planetary gear 431. An output shaft 41 of the engine 31 is connected to the planetary gear 431 through the transmission mechanism 421. As the engine 31, any internal combustion engine can be employed, but in this embodiment, as the engine 31, a spark-ignition type internal combustion engine including a plurality of cylinders (for example, four cylinders) is employed. The engine 31 generates drive power by combusting fuel (for example, gasoline) in each cylinder, and rotates a crankshaft (not shown) common to all cylinders using the generated drive power. The crankshaft of the engine 31 is connected to the output shaft 41 via a torsional damper (not shown). As the crankshaft rotates, the output shaft 41 also rotates. An example of the engine 31 is not limited to a gasoline engine, and may include a diesel engine or a hydrogen engine.

The output shaft 41 of the engine 31 corresponds to an input shaft of the transmission mechanism 421. The transmission mechanism 421 includes a clutch and a brake (neither shown), and is configured to change a gear ratio (that is, a ratio of rotation speed of the input shaft of the transmission mechanism 421 to rotation speed of an output shaft 42 of the transmission mechanism 421) depending on states (engagement/disengagement) of the clutch and the brake. The hydraulic pressure circuit 422 is configured to adjust hydraulic pressure supplied to each of the clutch and the brake included in the transmission mechanism 421 according to a command from the HVECU 50. The HVECU 50 may switch the state (engagement/disengagement) of each of the clutch and the brake included in the transmission mechanism 421 by controlling the hydraulic pressure circuit 422. In the configuration illustrated in FIG. 1, the transmission mechanism 421 is positioned on the upstream side (the planetary gear 431) of a power split device, but the transmission mechanism 421 may be positioned on the downstream side (the side close to drive wheels 45a, 45b).

The vehicle 100 further includes a shift lever 101 and a P position switch 102. Each of the shift lever 101 and the P position switch 102 is configured to be able to switch between a plurality of shift ranges according to a shift operation of a user. The user can select any of a neutral (N) range, a reverse (R) range, a drive (D) range, and a brake (B) range by moving the shift lever 101 to a predetermined position. Further, the user can select a parking (P) range by stopping the vehicle 100 and pressing the P position switch 102. The HVECU 50 switches the shift range of the vehicle 100 to a range selected by the user. The HVECU 50 controls the hydraulic pressure circuit 422 according to, for example, the shift range.

Each of the output shaft 42 of the transmission mechanism 421 and the rotor shaft 43a of the MG 21a is connected to the planetary gear 431. The planetary gear 431 has three rotating elements, that is, an input element, an output element, and a reaction force element. More specifically, the planetary gear 431 has a sun gear, a ring gear coaxially arranged with the sun gear, a pinion gear that meshes with the sun gear and the ring gear, and a carrier that holds the pinion gear such that it can rotate and revolve. The carrier corresponds to the input element, the ring gear corresponds to the output element, and the sun gear corresponds to the reaction force element.

The output shaft 42 of the transmission mechanism 421 is connected to the carrier of the planetary gear 431. The rotor shaft 43a of the MG 21a is connected to the sun gear of the planetary gear 431. Torque is input from the output shaft 42 of the transmission mechanism 421 to the carrier of the planetary gear 431. The planetary gear 431 is configured to, when the transmission mechanism 421 is in a non-neutral state (that is, a state of transferring the drive power), divide and transfer the torque output by the engine 31 to the sun gear (and thus the MG 21a) and the ring gear. When the torque output by the engine 31 is output to the ring gear, a reaction force torque output by the MG 21a acts on the sun gear.

The planetary gear 431 and the MG 21b are configured to combine drive power output from the planetary gear 431 (that is, drive power output to the ring gear) and drive power output from the MG 21b (that is, drive power output to the rotor shaft 43b) and transfer the combined power to drive wheels 45a, 45b. More specifically, an output gear (not shown) that meshes with a driven gear 432 is installed at the ring gear of the planetary gear 431. Further, a drive gear (not shown) installed at the rotor shaft 43b of the MG 21b also meshes with the driven gear 432. The driven gear 432 acts to combine torque output by the MG 21b to the rotor shaft 43b with torque output from the ring gear of the planetary gear 431. The drive torque combined as above is transferred to a differential gear 44, and further transferred to the drive wheels 45a, 45b via the drive shafts 44a, 44b extending to the right and left from the differential gear 44.

The vehicle 100 further includes a battery ECU 13, a motor ECU 23, an engine ECU 33, and an HVECU 50. In this embodiment, a computer (for example, a microcomputer) is employed as each of the battery ECU 13, the motor ECU 23, the engine ECU 33, and the HVECU 50. The ECUs are connected to each other in a manner capable of executing CAN communication therebetween.

The HVECU 50 includes a processor 51, a random access memory (RAM) 52, and a storage device 53. As the processor 51, for example, a central processing unit (CPU) can be employed. The RAM 52 functions as a working memory that temporarily stores data processed by the processor 51. The storage device 53 is configured to be able to retain the stored information. In addition to the program, the storage device 53 stores information (for example, a map, a mathematical formula, and various parameters) used in the program. When the processor 51 executes the program stored in the storage device 53, various processes are executed in the HVECU 50.

Although FIG. 1 illustrates a detailed configuration of only the HVECU 50, each of the other ECUs also includes a processor, a RAM, and a storage device. The number of processors included in each ECU is arbitrary, and any ECU may include a plurality of processors. Further, various processes in each ECU are not limited to execution by software, and may be executed by dedicated hardware (an electronic circuit).

Motor sensors 22a, 22b that detect states (for example, current, a voltage, a temperature, and rotation speed) of the MGs 21a, 21b are provided in the MGs 21a, 21b, respectively. Each of the motor sensors 22a, 22b outputs a detection result to the motor ECU 23. An engine sensor 32 that detects a state (for example, an air intake amount, air intake pressure, an air intake temperature, exhaust pressure, an exhaust temperature, a catalyst temperature, an engine coolant temperature, and rotation speed) of the engine 31 is provided in the engine 31. The engine sensor 32 outputs a detection result to the engine ECU 33. The HVECU 50 receives detection values of the motor sensors 22a, 22b and the engine sensor 32 from the motor ECU 23 and the engine ECU 33, as necessary. Further, the HVECU 50 receives a state (that is, a detection value of each of the voltage sensor 12a, the current sensor 12b, and a temperature sensor 12c) of the drive battery 11 from the battery ECU 13, as necessary.

The vehicle 100 includes a monitoring unit 80a that detects a state of an auxiliary battery 80 described below. The monitoring unit 80a includes various sensors that detect a state (for example, a temperature, current, a voltage) of the auxiliary battery 80, and outputs a detection result to the HVECU 50. The HVECU 50 can acquire the state (for example, the temperature, current, the voltage, and an SOC) of the auxiliary battery 80 based on an output of the monitoring unit 80a. Further, although not shown, other sensors (for example, a vehicle speed sensor, a fuel gauge, an odometer, an accelerator operation amount sensor, and an atmospheric pressure sensor) that indicate a situation of the vehicle 100 are also mounted on the vehicle 100. The HVECU 50 can grasp information of the vehicle 100 based on outputs of various sensors (in-vehicle sensors) mounted on the vehicle 100.

The HVECU 50 is configured to output a command (a control command) for controlling the engine 31 to the engine ECU 33. The engine ECU 33 is configured to control various actuators (for example, a throttle valve, an ignition device, and an injector) (none of them shown) of the engine 31 according to the command from the HVECU 50. The HVECU 50 can control the engine through the engine ECU 33.

The HVECU 50 is configured to output a command (a control command) for controlling each of the MG 21a and the MG 21b to the motor ECU 23. The motor ECU 23 is configured to generate a current signal (for example, a signal indicating a magnitude and frequency of current) corresponding to a target torque of each of the MG 21a and the MG 21b according to the command from the HVECU 50, and to output the generated current signal to the PCU 24. The HVECU 50 can control the motors through the motor ECU 23.

The PCU 24 includes, for example, two inverters (not shown) provided to correspond to the MGs 21a, 21b, and a converter (not shown) arranged between each inverter and the drive battery 11. The PCU 24 is configured to supply power accumulated in the drive battery 11 to each of the MG 21a and the MG 21b, and to supply power generated by each of the MG 21a and the MG 21b to the drive battery 11. The PCU 24 is configured to be able to separately control the states of the MGs 21a, 21b, that is, for example, it can turn the MG 21b to a power running state while turning the MG 21a to a power generation state. The MG 21a is configured to execute power generation (that is, engine power generation) using drive power output from the engine 31. The HVECU 50 charges the drive battery 11 with power generated by the engine power generation such that the SOC of the drive battery 11 does not become excessively low while the vehicle 100 is traveling. Further, the drive battery 11 is also charged with power generated by regenerative braking by the MG 21b.

The vehicle 100 is configured to execute HV traveling and EV traveling. The HV traveling is executed by the engine 31 and the MG 21b while the engine 31 is generating traveling driving power. The EV traveling is executed by the MG 21b when the engine 31 is in a stopped state. When the engine 31 is in the stopped state, combustion in each cylinder is not executed. When the combustion in each cylinder is stopped, combustion energy (and thus traveling driving power) is not generated in the engine 31.

The vehicle 100 further includes an auxiliary battery 80, DC/DC converters 81, 82, an auxiliary relay 83, a high voltage load 91, and a low voltage load 92. The full charge capacity of the auxiliary battery 80 is smaller than that of the drive battery 11. A full charge capacity of a battery is an electricity amount accumulated in the battery in a fully charged state and decreases as the battery deteriorates. As the auxiliary battery 80, for example, a lead battery can be employed. However, as the auxiliary battery 80, a secondary battery (for example, a nickel-hydrogen battery) other than the lead battery may be employed. The DC/DC converters 81, 82, the auxiliary relay 83, the high voltage load 91, and the low voltage load 92 are controlled by the HVECU 50. The HVECU 50 may control these through the battery ECU 13.

The high voltage load 91 is an auxiliary machine of a high voltage system. The low voltage load 92 is an auxiliary machine of a low voltage system. A drive voltage of the low voltage load 92 is lower than a drive voltage of the high voltage load 91. The auxiliary battery 80 is an in-vehicle battery of the low voltage system (for example, a 12 V system), and is configured to supply power to the low voltage load 92. In this embodiment, the high voltage load 91 includes air conditioning equipment and the low voltage load 92 includes a lighting device. The air conditioning equipment is configured to heat and cool a cabin of the vehicle 100. The lighting device includes a lighting device that illuminates the inside of the vehicle and a lighting device (for example, a headlight) that illuminates the outside of the vehicle. At least one of the high voltage load 91 and the low voltage load 92 may further include a seat heater that heats a seat of the vehicle 100.

The DC/DC converter 81 is provided between the drive battery 11 and the high voltage load 91, steps down power supplied from the drive battery 11 and outputs it to the high voltage load 91. The DC/DC converter 82 steps down power supplied from the drive battery 11 and outputs it to each of the auxiliary battery 80 and the low voltage load 92. When the SMR 14 is in the open state (the disconnected state), power of the drive battery 11 is not supplied to any of the high voltage load 91, the low voltage load 92, and the auxiliary battery 80. An auxiliary relay 83 is arranged in a current path that connects the DC/DC converter 82 to the low voltage load 92. When the auxiliary relay 83 is in the open state (the disconnected state), power is not supplied to the low voltage load 92.

When the SMR 14 is in the closed state (the connected state), power can be supplied from the drive battery 11 to the auxiliary battery 80 through the DC/DC converter 82. For example, when the SOC of the auxiliary battery 80 is lower than a predetermined value, the HVECU 50 charges the auxiliary battery 80 with power of the drive battery 11. Further, the HVECU 50 drives the high voltage load 91 and the low voltage load 92 using power of the drive battery 11 according to an instruction from a service tool 200 (see FIG. 2) in the deterioration diagnosis (see S16 and S22 of FIG. 3) of the assembled battery described below. At this time, the HVECU 50 controls the SMR 14, the DC/DC converters 81, 82, and the auxiliary relay 83 such that power of the drive battery 11 is supplied to each of the high voltage load 91 and the low voltage load 92.

The vehicle 100 further includes a power switch 103. The power switch 103 is used for switching between start/stop of a vehicle system (the HVECU 50 and the like). The power switch 103 is operated by the user.

The vehicle 100 further includes a notification device 104. The notification device 104 is configured to send a notification to the user of the vehicle 100 in response to a request from the HVECU 50. Examples of the notification device 104 can include a meter panel, a head-up display, a navigation display, a warning light, or a speaker. The notification device 104 may function as an input device that receives an input from the user. The notification device 104 may include a touch panel display or a smart speaker that receives a voice input. The notification device 104 may be mounted on a portable device (that is, an electronic device that can be carried by the user), such as a tablet terminal, a smartphone, or a wearable device.

Figure 2:
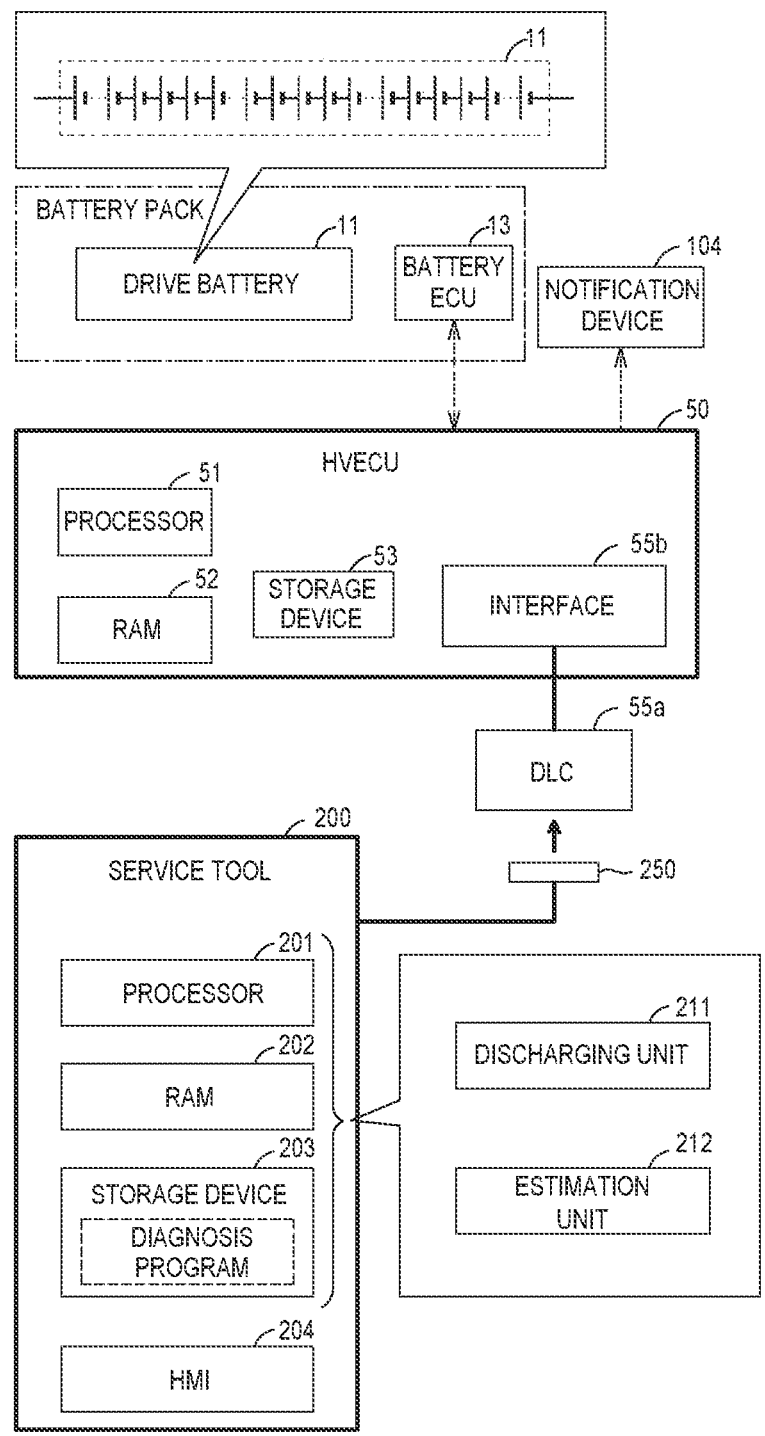
FIG. 2 is a diagram illustrating a configuration of a deterioration diagnosis apparatus of an assembled battery according to the embodiment of the present disclosure.

FIG. 2 is a diagram illustrating a configuration of a deterioration diagnosis apparatus of an assembled battery according to this embodiment. With reference to FIG. 2 together with FIG. 1, in this embodiment, the service tool 200 functions as a deterioration diagnosis apparatus of an assembled battery. The service tool 200 includes a computer including a processor 201, a RAM 202, and a storage device 203. The storage device 203 stores a diagnosis program. A deterioration diagnosis method (see FIGS. 3 and 7 described below) of an assembled battery according to this embodiment is executed when the processor 201 executes the diagnosis program stored in the storage device 203.

The service tool 200 further includes a human machine interface (HMI) 204. The HMI 204 includes an input device and a display device. The HMI 204 may be a touch panel display. The HMI 204 may include a smart speaker that receives a voice input.

The HVECU 50 further includes a data link connector (DLC) 55a and an interface 55b of the DLC 55a. The DLC 55a is a connector that can be connected to a connector 250 of the service tool 200, and is arranged in, for example, the vicinity of a driver seat of the vehicle 100. The service tool 200 is an external diagnosis machine used by, for example, a worker (such as a mechanic) in a maintenance shop to grasp a state of a vehicle. Examples of the service tool 200 can include a general scan tool (GST). By connecting the connector 250 of the service tool 200 to the DLC 55a, the service tool 200 can read vehicle data stored in the storage device 53.

In the deterioration diagnosis method of the assembled battery according to this embodiment, the service tool 200 acquires voltage data indicating a transition of a voltage of a cell inferred to be a minimum capacity cell (a cell having the smallest full charge capacity in the assembled battery) from a discharging start voltage to a predetermined discharging end voltage (hereinafter, referred to as "$V_{end2}$"), and estimates a deterioration degree of the drive battery 11 (the assembled battery) using the acquired voltage data of the minimum capacity cell.

As a method of estimating the minimum capacity cell, a method where a cell (hereinafter, referred to as a "target cell") of which a voltage has reached $V_{end1}$ earliest during the discharging of all the cells included in the drive battery 11 is inferred to be the minimum capacity cell is considered. However, this method has low estimation accuracy. On the other hand, when the discharging is continued until the voltages of all the cells included in the assembled battery reach $V_{end1}$ in order to accurately specify the minimum capacity cell, a possibility that one or more cells may be over-discharged is high. Over-discharging accelerates deterioration of a cell.

Therefore, in the deterioration diagnosis method of the assembled battery according to this embodiment, even when the voltage of the target cell reaches the discharging end voltage during the discharging of all the cells included in the drive battery 11, the discharging of the assembled battery is continued until the discharging end timing, which is decided based on the voltage data of the target cell, without stopping the discharging of the assembled battery. Using the voltage data of the target cell, it is easy to appropriately decide the discharging end timing. As such, it is easy to raise accuracy of the deterioration diagnosis of the assembled battery while restricting deterioration of the cell during the diagnosis of the assembled battery.

The service tool 200 according to this embodiment includes a discharging unit 211 and an estimation unit 212. The discharging unit 211 is configured to discharge all the cells included in the drive battery 11, measure the voltage of each cell during the discharging, and end the discharging at the discharging end timing. The estimation unit 212 is configured to estimate the deterioration degree of the drive battery 11 using the acquired voltage data indicating the transition of the voltage of at least one cell included in the drive battery 11 from the discharging start voltage to $V_{end1}$. The discharging unit 211 is configured to, when a voltage of any cell (a target cell) included in the drive battery 11 reaches $V_{end1}$, decide the discharging end timing using voltage data of the cell (the target cell).

Figure 3:
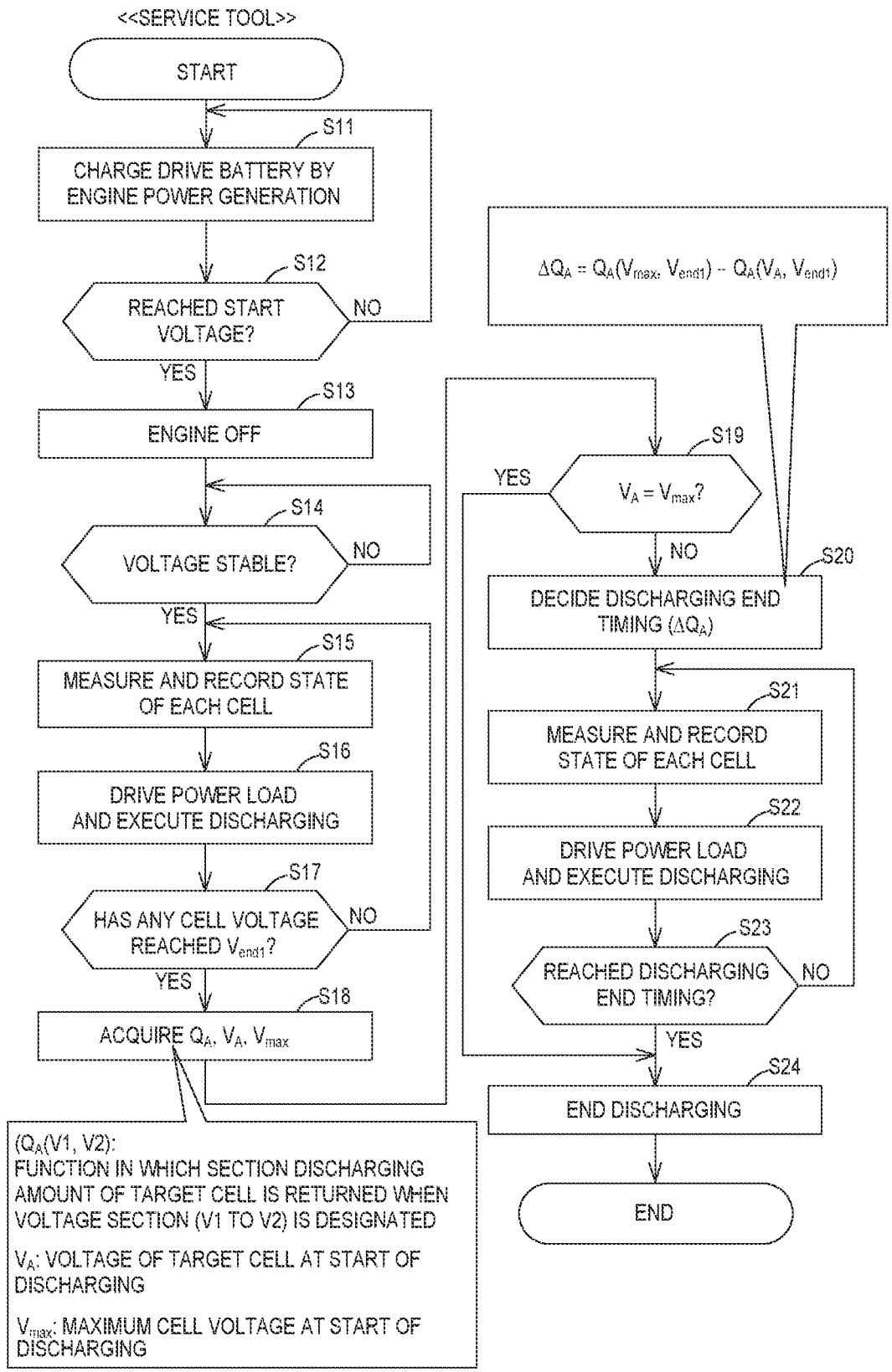
FIG. 3 is a flowchart illustrating a discharging control in a deterioration diagnosis method of the assembled battery according to the embodiment of the present disclosure.

FIG. 3 is a flowchart illustrating discharging control in the deterioration diagnosis method of the assembled battery according to this embodiment. Processes illustrated in this flowchart are executed when, for example, a predetermined instruction is input from the user to the HMI 204 after the connector 250 of the service tool 200 is connected to the DLC 55a of the vehicle 100 in a parked state. However, a condition of starting the process illustrated in FIG. 3 is not limited thereto, and can be arbitrarily set. The discharging unit 211 of the service tool 200 transmits a control command to the HVECU 50, whereby each step of FIG. 3 is executed. Hereinafter, each step in the flowchart is simply referred to as "S".

With reference to FIG. 3 together with FIGS. 1 and 2, in S11, the service tool 200 drives the engine 31 and charges the drive battery 11 with power generated by the engine power generation. By the process of S11, power generated by the MG 21a using drive power output from the engine 31 is input to the drive battery 11 via the PCU 24 and the SMR 14.

In S12, the service tool 200 determines whether the voltages of all the cells included in the drive battery 11 have become a predetermined start voltage (hereinafter, referred to as "$V_{start}$") or higher. The voltage of each cell included in the drive battery 11 is measured by the voltage sensor 12a. $V_{start}$ may be a cell voltage indicating that the cell has turned to the fully charged state, or may be a voltage slightly lower than the cell voltage in the fully charged state. $V_{start}$ may be 3.7 V or higher and 3.9 V or lower.

The processes of S11 and S12 are repeated until the voltages of all the cells included in the drive battery 11 become $V_{start}$ or higher (NO in S12). When the voltages of all the cells become $V_{start}$ or higher (YES in S12), in S13, the service tool 200 stops the engine 31. Thereafter, in S14, the service tool 200 determines whether the voltages of all the cells included in the drive battery 11 have become stable. The process stands by in S14 until the voltage of each cell included in the drive battery 11 becomes stable, and, when the voltage of each cell included in the drive battery 11 becomes stable (YES in S14), the process proceeds to S15.

In S15, the service tool 200 measures a state (a voltage, current, and a temperature) of each cell included in the drive battery 11, and records a measurement result in the storage device 203. Subsequently in S16, the service tool 200 discharges the drive battery 11 by controlling a power load of the vehicle 100. The drive battery 11 is configured to supply power to the power load mounted on the vehicle 100.

Specifically, in S16, the service tool 200 controls the power load (for example, at least one of the high voltage load 91 and the low voltage load 92) of the vehicle 100 such that discharging current of each cell included in the drive battery 11 becomes a predetermined value (hereinafter, referred to as "Vd"). In this embodiment, the air conditioning equipment (the high voltage load 91) and the lighting device (the low voltage load 92) are driven by power supplied from the drive battery 11. The service tool 200 adjusts power supplied from the drive battery 11 to the high voltage load 91 and the low voltage load 92, using the DC/DC converters 81, 82, respectively. Then, the service tool 200 maintains a current value during the discharging of each cell included in the drive battery 11. Vd may be 1 A or higher and 10 A or lower, or may be approximately 5 A. In this embodiment, the current value during the discharging of each cell is maintained at Vd. In this embodiment, Vd is set to a fixed value (for example, 5 A), but Vd may be variable depending on the situation.

Figure 4:
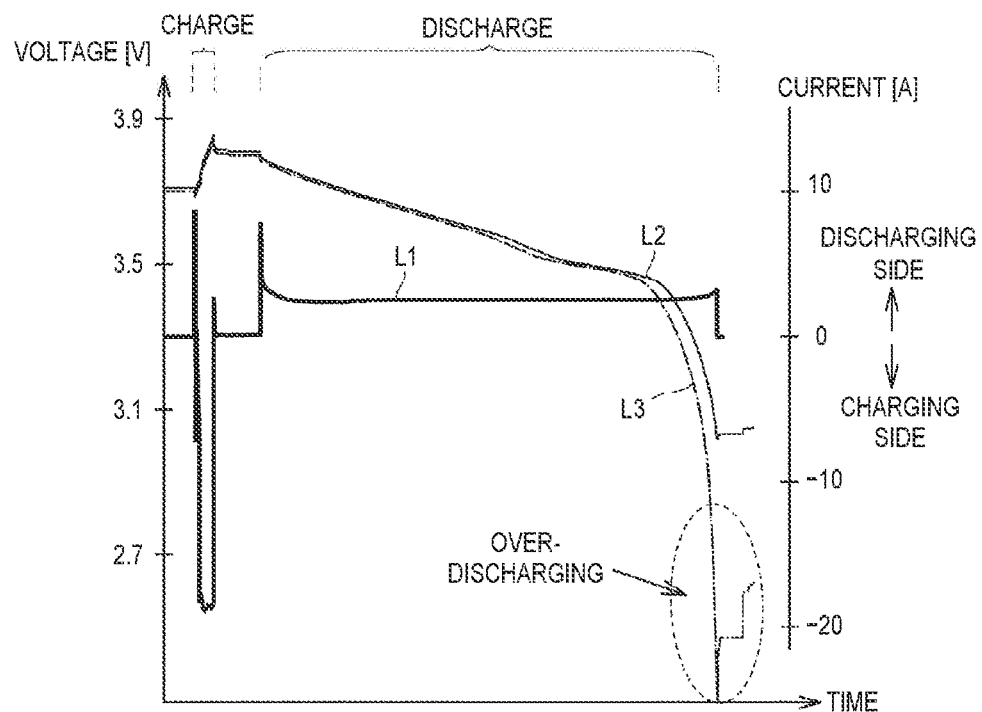
FIG. 4 is a graph for describing a discharging characteristic of the assembled battery illustrated in FIG. 2.

FIG. 4 is a graph for describing a discharging characteristic of the drive battery 11 (the assembled battery). Each of lines L1 to L3 in FIG. 4 illustrates an example of a transition of current and a voltage of the drive battery 11 (the assembled battery) when S11 to S16 of FIG. 3 are executed. The line L1 illustrates a transition of current of the drive battery 11. Lines L2 and L3 respectively illustrate the discharging characteristics (more specifically, the transitions of the cell voltages during the discharging) of a first cell and a second cell included in the drive battery 11. Specifically, a full charge capacity of the first cell is larger than that of the second cell. With reference to FIG. 4, in a comparison between the transition of a voltage of the first cell (the line L2) and the transition of a voltage of the second cell (the line L3), the voltage of the second cell starts to decrease earlier than that of the first cell and decreases to a voltage lower than a voltage to which the voltage of the first cell decreases. As such, the cell voltage tends to easily decrease during the discharging as a full charge capacity is smaller. When the voltage of the cell decreases too much due to the discharging of the cell, the deterioration of the cell is accelerated. The fact that the discharging of the voltage of the cell is continued until it decreases too much is referred to as the "over-discharging". In the example illustrated by the line L3, the discharging is continued until the cell reaches the over-charging. However, in the deterioration diagnosis method of the assembled battery according to this embodiment, the discharging end timing is set such that the cell does not reach the over-discharging.

With reference to FIG. 3 together with FIGS. 1 and 2 again, in S17, the service tool 200 determines whether a voltage of any cell (the target cell) included in the drive battery 11 has reached a predetermined $V_{end1}$. $V_{end1}$ is set based on a discharging lower limit voltage common to all the cells included in the drive battery 11. The discharging lower limit voltage corresponds to a lower limit voltage regarding the discharging. When the discharging of a cell is continued until its voltage falls below the discharging lower limit voltage, the cell may be over-discharged. In this embodiment, $V_{end1}$ is set to a voltage slightly higher than the discharging lower limit voltage (for example, a value obtained by adding an extra voltage to the discharging lower limit voltage). $V_{end1}$ may be 2.8 V or higher and 3.2 V or lower. In this embodiment, $V_{end1}$ is set to 3.0 V. Until a negative determination is made in S17, the processes of S15 to S17 are repeated. When a voltage of any cell included in the drive battery 11 reaches $V_{end1}$ (YES in S17), the process proceeds to S18. A cell of which a voltage has reached $V_{end1}$ earliest from among all the cells included in the drive battery 11 corresponds to the target cell.

In S18, the service tool 200 acquires a voltage (hereinafter, referred to as "$V_A$") of the target cell at a start of the discharging, a maximum cell voltage (hereinafter, referred to as "$V_{max}$"), and a function (hereinafter, referred to as "$Q_A$") indicating a discharging characteristic of the target cell, using the data acquired in S15. From among voltages (measured in S15) of the cells included in the drive battery 11 at the start of the discharging, the highest voltage is $V_{max}$ and the voltage of the target cell is $V_A$. In other words, $V_A$ is $V_{max}$ or lower.

The service tool 200 can derive $Q_A$ using the voltage data indicating the transition (measured in S15) of the voltage of the target cell from $V_A$ (the discharging start voltage) to $V_{end1}$ (the discharging end voltage). $Q_A$ may be specified using the least squares method. $Q_A$ is a function in which a section discharging amount (Ah) of the target cell for a designated section is returned. For example, when $V_A$ and $V_{end1}$ are input to $Q_A$, $Q_A$ outputs a discharging amount of the target cell in a voltage section from $V_A$ to $V_{end1}$. The discharging amount corresponds to a time integral value of a discharging current (A). When the discharging current fluctuates within a section, the section discharging amount can be obtained by integrating the discharging current for each unit time with respect to time. When the discharging current is constant within the section, a value obtained by multiplying the discharging current (A) by the discharging period (h) corresponds to the discharging amount.

Subsequently in S19, the service tool 200 determines whether $V_A$ corresponds to $V_{max}$. Then, when $V_A$ corresponds to $V_{max}$ (YES in S19), in S24, the service tool 200 ends the discharging of the drive battery 11. On the other hand, when $V_A$ does not correspond to $V_{max}$ (NO in S19), in S20, the service tool 200 decides the discharging end timing using $Q_A$, $V_A$, and $V_{max}$. Hereinafter, with reference to FIGS. 5 and 6, a method of deciding the discharging end timing in the deterioration diagnosis method of the assembled battery according to this embodiment will be described.

Figure 5:
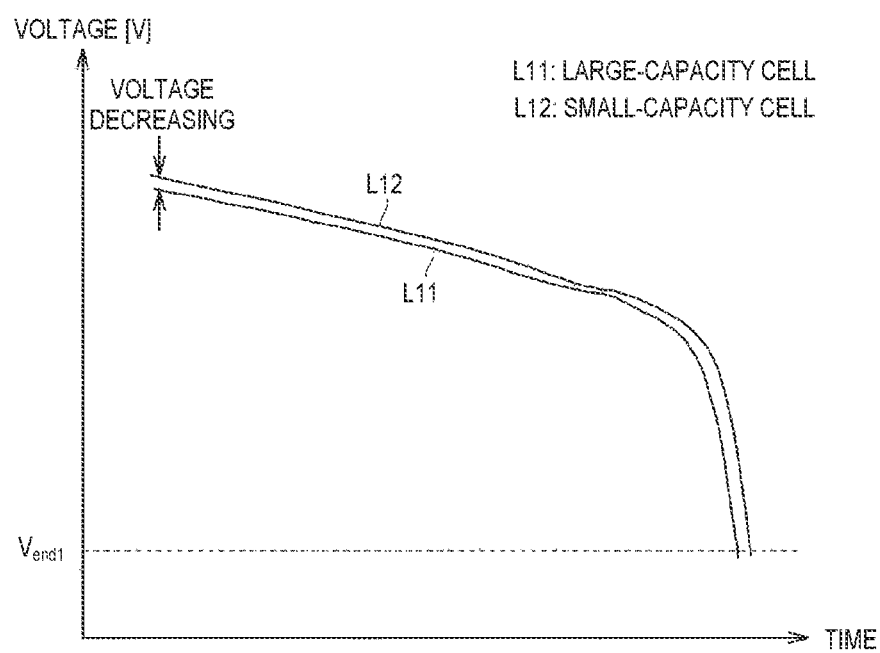
FIG. 5 is a first graph for describing a method of deciding a discharging end timing in the deterioration diagnosis method of the assembled battery according to the embodiment of the present disclosure.

FIG. 5 is a first graph for describing the method of deciding the discharging end timing in the deterioration diagnosis method of the assembled battery according to this embodiment. Lines L11 and L12 in FIG. 5 respectively illustrate the discharging characteristics of a third cell and a fourth cell included in the drive battery 11. Specifically, a full charge capacity of the third cell is larger than that of the fourth cell. With reference to FIG. 5, in a comparison between a transition (the line L11) of a voltage of the third cell and a transition (the line L12) of a voltage of the fourth cell, the voltage of the third cell at the start of the discharging is lower than the voltage of the fourth cell at the start of the discharging, and the voltage of the third cell reaches $V_{end1}$ earlier than the voltage of the fourth cell. As such, when voltage variations exist between the cells at the start of the discharging, the lower the voltage of the cell at the start of the discharging, the easier the voltage early reaches $V_{end1}$. In the discharging of the drive battery 11, basically, the smaller the full charge capacity of the cell, the easier the cell voltage tends to decrease (see FIG. 4). However, as illustrated in FIG. 5, a case where a voltage of a cell having a large full charge capacity reaches $V_{end1}$ earlier than a voltage of a cell having a small full charge capacity can also occur. Therefore, in the deterioration diagnosis method of the assembled battery according to this embodiment, even when the voltage of the target cell reaches $V_{end1}$, the discharging of the drive battery 11 is continued until the discharging end timing without stopping the discharging of the drive battery 11.

Figure 6:
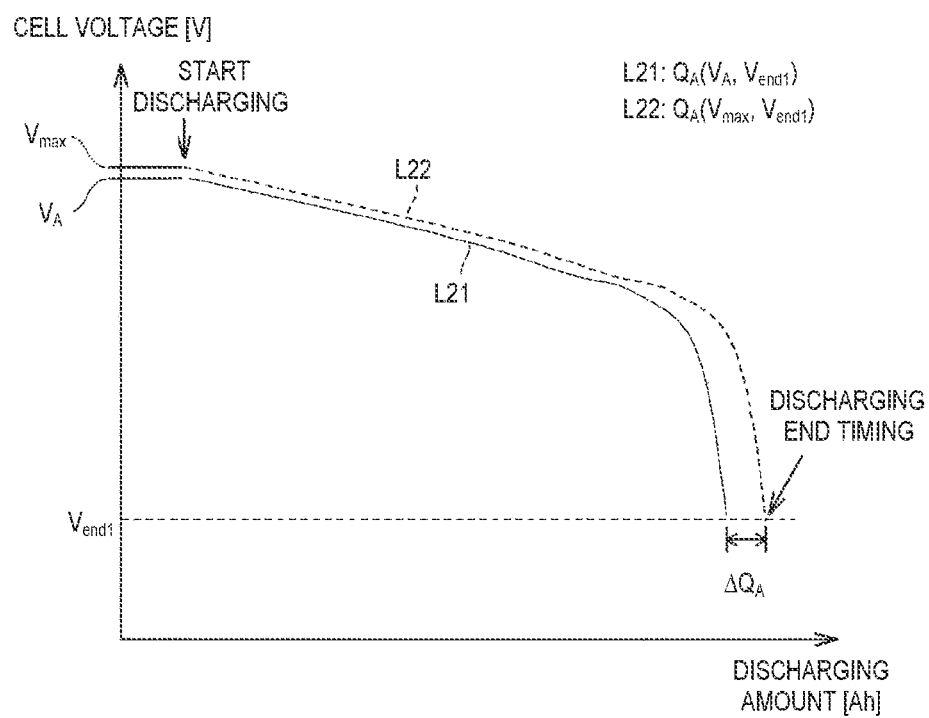
FIG. 6 is a second graph for describing the method of deciding the discharging end timing in the deterioration diagnosis method of the assembled battery according to the embodiment of the present disclosure.

FIG. 6 is a second graph for describing the method of deciding the discharging end timing in the deterioration diagnosis method of the assembled battery according to this embodiment. A line L21 in FIG. 6 illustrates a transition of the discharging amount of the target cell in the voltage section from $V_A$ to $V_{end1}$. A line L22 in FIG. 6 illustrates a transition of the voltage of the target cell when assuming that the discharging of the target cell is started from $V_{max}$.

With reference to FIG. 6, the service tool 200 decides that the timing at which the discharging amount of the target cell reaches $\Delta Q_A$ after the voltage (the line L21) of the target cell has reached $V_{end1}$ is the discharging end timing.

Specifically, in S19 of FIG. 3, the service tool 200 determines whether $V_A$ (the voltage of the target cell at the start of the discharging) corresponds to $V_{max}$ (the maximum cell voltage). When it is determined that $V_A$ corresponds to $V_{max}$ ($V_A = V_{max}$) (YES in S19), the line L21 matches the line L22, and $\Delta Q_A$ becomes zero. For this reason, the service tool 200 decides that the timing at which the voltage of the target cell has reached $V_{end1}$ is the discharging end timing. As such, the discharging of the drive battery 11 is ended immediately after the voltage of the target cell has reached $V_{end1}$ (S24 of FIG. 3).

On the other hand, upon determining that $V_A$ does not correspond to $V_{max}$ (NO in S19), in S20 of FIG. 3, the service tool 200 decides that the timing at which the voltage of the target cell reaches $V_{end1}$ when assuming that the discharging of the target cell is started from $V_{max}$ is the discharging end timing. Specifically, the service tool 200 sets, as $\Delta Q_A$, a value obtained by subtracting the section discharging amount (the discharging amount from $V_A$ to $V_{end1}$) of the target cell, obtained by inputting $V_A$ and $V_{end1}$ to $Q_4$, from the section discharging amount (the discharging amount from $V_{max}$ to $V_{end1}$) of the target cell, obtained by inputting $V_{max}$ and $V_{end1}$ to $Q_4$. When the discharging of the drive battery 11 is continued until the timing at which the voltage of the target cell reaches $V_{end1}$ when assuming that the discharging of the target cell is started from $V_{max}$, it is considered that the voltage of the minimum capacity cell included in the drive battery 11 reaches $V_{end1}$.

With reference to FIG. 3 together with FIGS. 1 and 2 again, when the discharging end timing is decided in S20, processes of S21 and S22 are executed. In S21 and S22, the same processes as those of S15 and S16 described above are executed, respectively. By the process of S22, the discharging of the drive battery 11 is continued. In S23, the service tool 200 determines whether the discharging end timing has arrived. Specifically, the service tool 200 starts accumulation of the discharging amount from the timing at which the voltage of the target cell has reached $V_{end1}$, and determines that the discharging end timing has arrived when the accumulated discharging amount has reached $\Delta Q_A$ (see FIG. 6). Until a negative determination is made in S23, the processes of S21 to S23 are repeated. When the discharging end timing arrives (YES in S23), in S24, the service tool 200 ends the discharging of the drive battery 11.

By the above-described processes illustrated in FIG. 3, the data indicating a state (particularly, the deterioration degree) of the drive battery 11 is recorded in the storage device 203 of the service tool 200. The service tool 200 estimates the deterioration degree of the drive battery 11 using the recorded data of the drive battery 11. Then, the service tool 200 determines whether a life of the drive battery 11 has run out (that is, whether the use of drive battery 11 can be continued).

Figure 7:
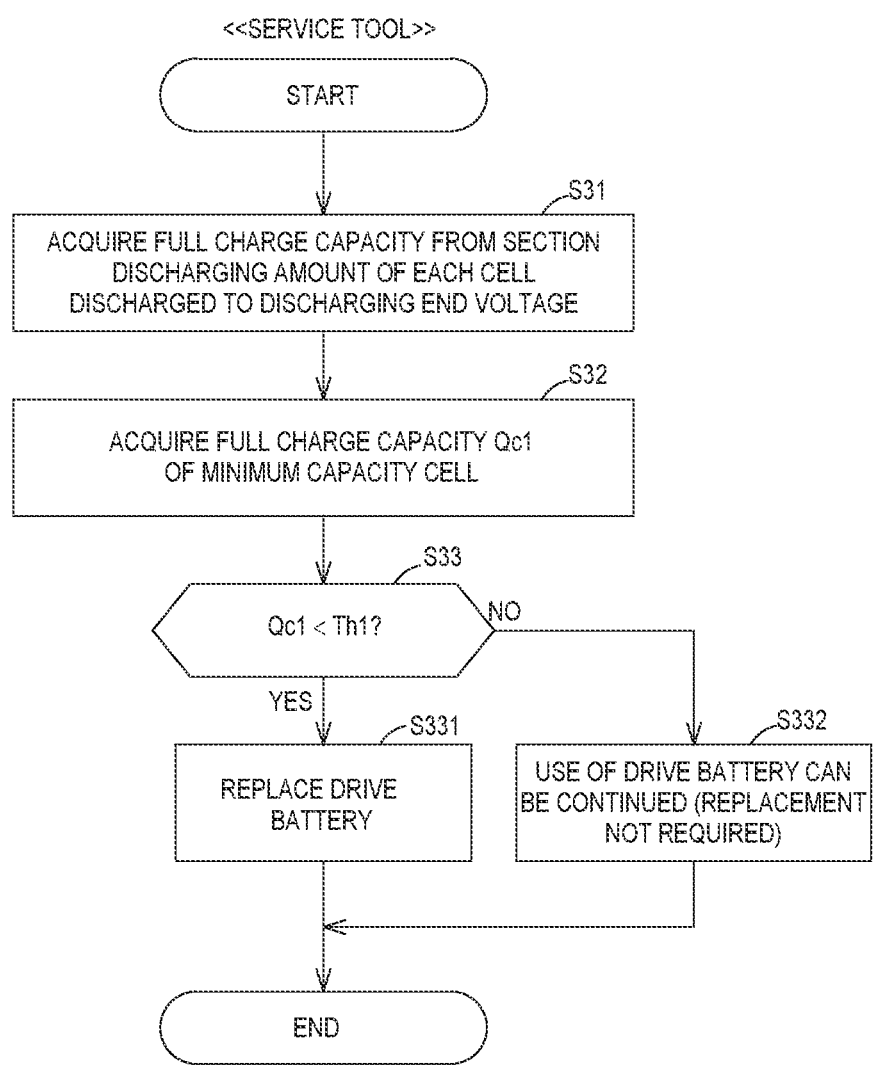
FIG. 7 is a flowchart illustrating processes regarding a determination of a battery life in the deterioration diagnosis method of the assembled battery according to the embodiment of the present disclosure.

FIG. 7 is a flowchart illustrating processes regarding a determination of a battery life in the deterioration diagnosis method of the assembled battery according to this embodiment. The processes illustrated in this flowchart are executed when a predetermined instruction is input from the user to the HMI 204 after the service tool 200 acquires the data of the drive battery 11 by, for example, the processes illustrated in FIG. 3. However, a condition for starting the process illustrated in FIG. 7 is not limited thereto and can be arbitrarily set. For example, the process illustrated in FIG. 7 may be automatically started after the process illustrated in FIG. 3 end. Each step illustrated in FIG. 7 is executed by the estimation unit 212 of the service tool 200. The processes illustrated in FIG. 7 may be executed in a state where the vehicle 100 and the service tool 200 are connected to each other, or may be executed in a state where the service tool 200 is removed from the vehicle 100.

With reference to FIG. 7 together with FIGS. 1 and 2, in S31, the service tool 200 obtains a full charge capacity of each cell of which a voltage has reached $V_{end1}$ until the discharging end timing from among all the cells included in the drive battery 11. In a case where only the voltage of the target cell reaches $V_{end1}$ even when the discharging is continued until the discharging end timing, only the full charge capacity of the target cell is obtained.

In order to obtain the full charge capacity of the cell in S31, the service tool 200 uses the data (that is, the data recorded in the storage device 203 by the processes of S15 and S21 of FIG. 3 during the discharging of the drive battery 11) of the drive battery 11 acquired by the processes illustrated in FIG. 3. In this embodiment, the service tool 200 calculates the section discharging amount (for example, the section discharging amount from the discharging start voltage to $V_{end1}$) of the cell and converts the section discharging amount into the full charge capacity using a predetermined map. A map illustrating a relationship between a temperature of the cell, the section discharging amount, and the full charge capacity may be used to obtain the full charge capacity of the cell. When the temperature of the cell and the section discharging amount are given to the map, the full charge capacity of the cell is output from the map. The temperature of the cell that is used may be the average temperature during the discharging or the temperature at the start of the discharging. The map may be stored in the storage device 203 in advance. The service tool 200 may acquire the map from an external server (for example, a server that manages information on various batteries), or may acquire the map from the vehicle 100.

Subsequently in S32, the service tool 200 acquires the full charge capacity (hereinafter, referred to as "Qc1") of the minimum capacity cell in the drive battery 11. Specifically, the service tool 200 estimates the smallest full charge capacity from among the full charge capacities of the cells obtained in S31 to be Qc1. By continuing the discharging of the drive battery 11 until the discharging end timing decided in S18 to S20 of FIG. 3, estimation accuracy of Qc1 in S32 becomes high.

Subsequently in S33, the service tool 200 determines whether Qc1 is lower than a predetermined reference value (hereinafter, referred to as "Th1"). Th1 is a threshold value indicating the life of the drive battery 11 in the vehicle 100. The fact that Qc1 is smaller than Th1 means that the life of the drive battery 11 for a current purpose has run out. Th1 may be stored in the storage device 203 in advance. The service tool 200 may acquire Th1 from an external server (for example, a server that manages information on various batteries) or may acquire Th1 from the vehicle 100.

When Qc1 is lower than Th1 (YES in S33), in S331, the service tool 200 prompts a replacement of the drive battery 11. For example, the HMI 204 or the notification device 104 displays a message indicating that a time to replace the drive battery 11 has arrived. However, the present disclosure is not limited thereto, and the HMI 204 may prompt the replacement of the drive battery 11 by sound (including voice). Alternatively, the service tool 200 may send a predetermined notification (for example, a notification indicating that a replacement of the drive battery 11 is required) to a terminal (for example, a smartphone or a wearable device) carried by the user of the vehicle 100. After the process of S331, the drive battery 11 is replaced. In this embodiment, a battery pack including the drive battery 11 is replaced. However, the present disclosure is not limited thereto, and the assembled battery may be replaced (rebuilt) by a unit of a cell. The drive battery 11 removed from the vehicle 100 may be used for other purposes.

On the other hand, when Qc1 is Th1 or higher (NO in S33), in S332, the service tool 200 sends a notification indicating that a replacement of the drive battery 11 is not required. For example, the HMI 204 or the notification device 104 displays a message indicating that the use of the drive battery 11 can be continued. In this case, the use of the drive battery 11 in the vehicle 100 is continued.

When the process of S331 or S332 is executed, a series of processes illustrated in FIG. 7 ends. The service tool 200 may store a diagnosis result of S331 or S332 in the vehicle 100 (for example, the storage device 53 of the HVECU 50).

As described above, the deterioration diagnosis method of the assembled battery according to this embodiment includes a series of processes illustrated in FIG. 3 and a series of processes illustrated in FIG. 7. In the processes illustrated in FIG. 3, the service tool 200 discharges each cell while measuring the voltage of each cell included in the drive battery 11 (S15 and S16). When a voltage of any cell reaches a predetermined discharging end voltage during the discharging (YES in S17), the service tool 200 decides the discharging end timing based on the voltage data indicating the transition of the voltage of the cell from the discharging start voltage to the discharging end voltage (S18 to S20). Then, when the discharging end timing arrives (YES in S19 or S23), the service tool 200 ends the discharging of the drive battery 11 (S24). In the processes illustrated in FIG. 7, the deterioration degree (for example, Qc1) of the drive battery 11 is estimated using the voltage data of one or more cells acquired during the discharging. With such a deterioration diagnosis method of the assembled battery, the discharging end timing is appropriately decided based on the voltage data of the target cell. For this reason, it is possible to enhance the accuracy of the deterioration diagnosis of the assembled battery while restricting the deterioration of the cell during the diagnosis of the assembled battery. Further, in the above method, the drive battery 11 is discharged while it is mounted on the vehicle 100. Since the capacity of the drive battery 11 to be diagnosed is 5 kWh or smaller, it is possible to execute the diagnosis with sufficient throughput.

Figure 8:
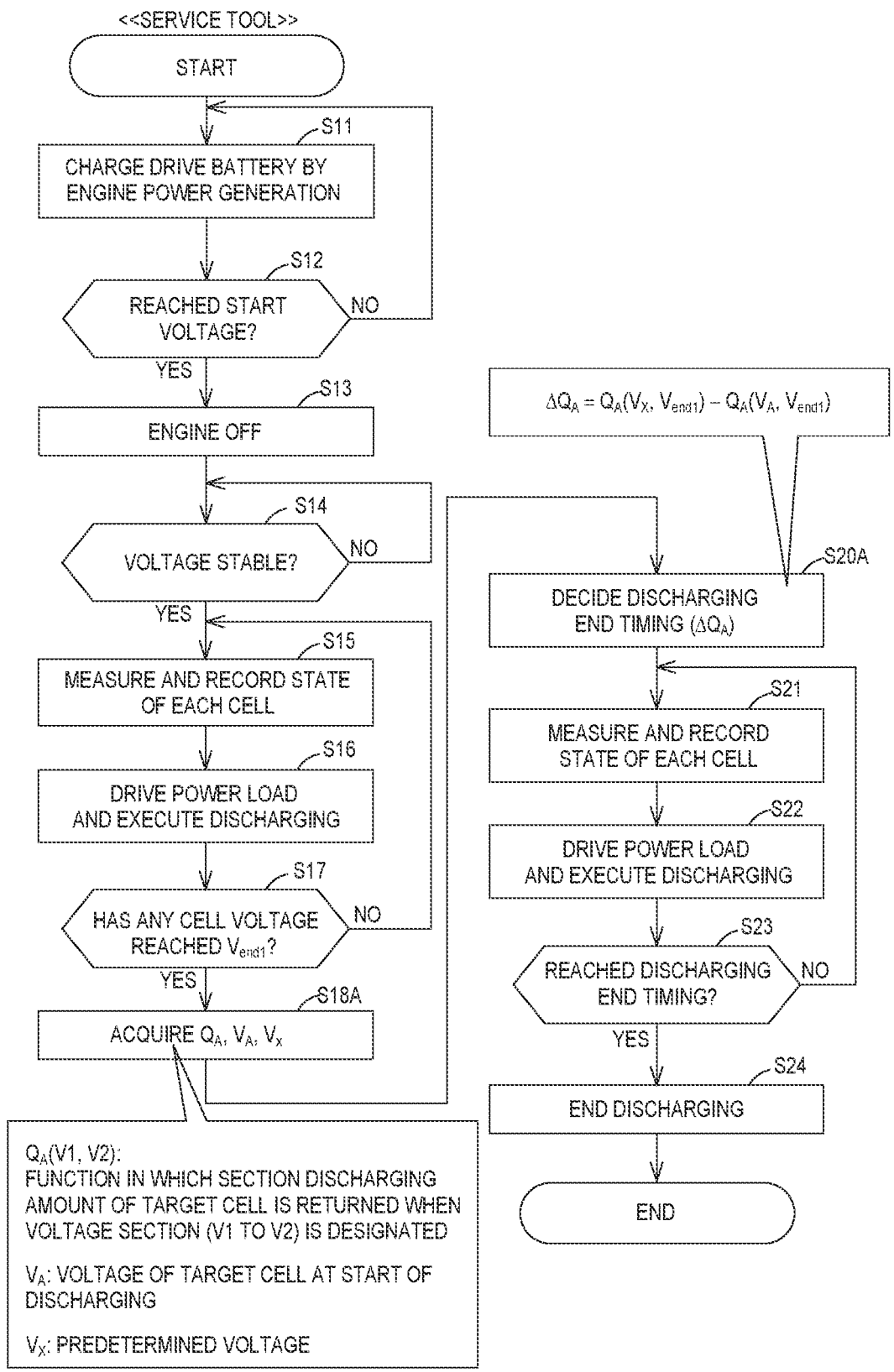
FIG. 8 is a flowchart illustrating a modified example 1 of processes illustrated in FIG. 3.

The processes illustrated in FIG. 3 may be appropriately changed. FIG. 8 is a flowchart illustrating a modified example 1 of the processes illustrated in FIG. 3. The processes illustrated in FIG. 8 are equivalent to those illustrated in FIG. 3 except that the discharging end timing is decided in S18A and S20A instead of S18 to S20 (see FIG. 3).

With reference to FIG. 8, in S18A, the service tool 200 acquires $V_A$ (a voltage of the target cell at the start of the discharging) and $Q_A$ (a function indicating a discharging characteristic of the target cell) using the data acquired in S15. In this modified example, the service tool 200 further acquires a predetermined voltage (hereinafter, referred to as "$V_x$") in S18A. $V_x$ correlates with a discharging period of the drive battery 11. In this modified example, $V_x$ is decided by experiments or simulation in advance such that the discharging of the drive battery 11 is continued by an appropriate discharging amount (or time) after the voltage of the target cell has reached $V_{end1}$ (the discharging end voltage). $V_x$ is stored in, for example, the storage device 203.

In S20A, the service tool 200 decides the discharging end timing using $Q_A$, $V_A$, and $V_x$. For example, the service tool 200 decides that the timing at which the voltage of the target cell reaches $V_{end1}$ when assuming that the discharging of the target cell is started from $V_x$ is the discharging end timing. Specifically, the service tool 200 sets, as $\Delta Q_A$, a value obtained by subtracting the section discharging amount (the discharging amount from $V_A$ to $V_{end1}$) of the target cell, obtained by inputting $V_A$ and $V_{end1}$ to $Q_A$, from the section discharging amount (the discharging amount from $V_x$ to $V_{end1}$) of the target cell, obtained by inputting $V_x$ and $V_{end1}$ to $Q_A$. Then, the service tool 200 decides that the timing at which the discharging amount of the target cell reaches $\Delta Q_A$ after the voltage of the target cell has reached $V_{end1}$ is the discharging end timing.

In the service tool 200 according to the modified example, the discharging unit 211 is configured to decide that the timing at which the voltage of the target cell reaches $V_{end1}$ when assuming that the discharging of the target cell is started from $V_x$ is the discharging end timing. $V_x$ may be a fixed value or may be variable depending on the situation. When $V_x$ is a fixed value, the lower $V_A$ is, the higher $\Delta Q_A$ becomes. An upper limit value (a guard value) may be set for $\Delta Q_A$ such that the target cell does not excessively deteriorate due to the over-discharging. Further, the discharging unit 211 may decide $V_x$ using the voltage of each cell included in the drive battery 11 at the start of the discharging. For example, the discharging unit 211 may calculate the average value (hereinafter, referred to as "$V_{ave}$") of voltages of the cells in the drive battery 11 at the start of the discharging, and determine a threshold value based on $V_{ave}$. The threshold value may be the same value as $V_{ave}$, or may be a value lower than $V_{ave}$. Then, when $V_A$ is higher than the threshold value, the discharging unit 211 may set $V_{max}$ (the maximum cell voltage) as $V_x$, and when $V_A$ is lower than the threshold value, it may set a value lower than $V_{max}$ as $V_x$.

In the above embodiment, the discharging unit 211 and the estimation unit 212 in the service tool 200 are embodied by the processor 201 and a program executed by the processor 201. However, the present disclosure is not limited thereto, and the discharging unit 211 and the estimation unit 212 may be embodied by dedicated hardware (an electronic circuit).

Figure 9:
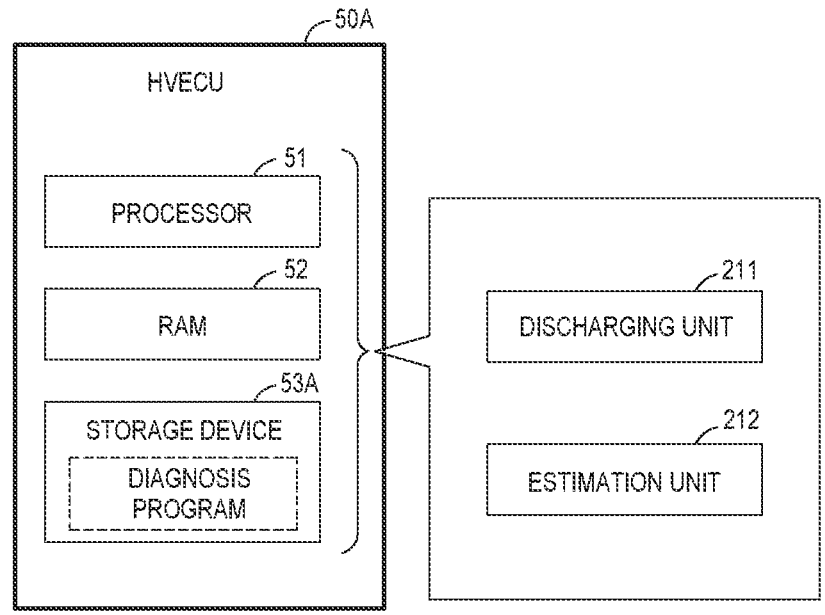
FIG. 9 is a diagram illustrating a modified example of an HVECU illustrated in FIG. 2.

Further, functions of the discharging unit 211 and the estimation unit 212 may be implemented in the vehicle 100. FIG. 9 is a flowchart illustrating a modified example of the HVECU 50 illustrated in FIG. 2. With reference to FIG. 9, an HVECU 50A mounted on the vehicle 100 may include the discharging unit 211 and the estimation unit 212. The discharging unit 211 and the estimation unit 212 in the HVECU 50A may be embodied by the processor 51 and a program executed by the processor 51 (for example, a diagnosis program stored in a storage device 53A).

In the above embodiment, the assembled battery mounted on the HEV which does not include an inlet for a plug-in is a target of the deterioration diagnosis. However, the present disclosure is not limited thereto, and an assembled battery mounted on a plug-in hybrid electric vehicle (PHEV) which includes an inlet for a plug-in may be a target of the deterioration diagnosis. Further, an assembled battery mounted on other xEVs (for example, a BEV, an FCEV, a range extender EV) may be a target of the deterioration diagnosis. The xEV is a vehicle that uses power as all or part of a drive power source.

In the above embodiment, the diagnosis of the deterioration due to the discharging is described. However, the present disclosure is not limited thereto, and it is also possible to execute the charging instead of the discharging and estimate the deterioration degree of the assembled battery from the transition of the voltage during the charging. Hereinafter, with reference to FIG. 10 to FIG. 13, a diagnosis of a deterioration due to the charging will be described focusing on differences from the diagnosis of the deterioration due to the discharging. In the diagnosis of the deterioration due to the charging described below, an assembled battery (a drive battery) mounted on a battery electric vehicle (BEV) having a function of vehicle-to-home (V2H) is set as a target of the deterioration diagnosis. A full charge capacity of the assembled battery of which the deterioration is diagnosed in an initial state may be, for example, approximately 100 kWh.

Figure 10:
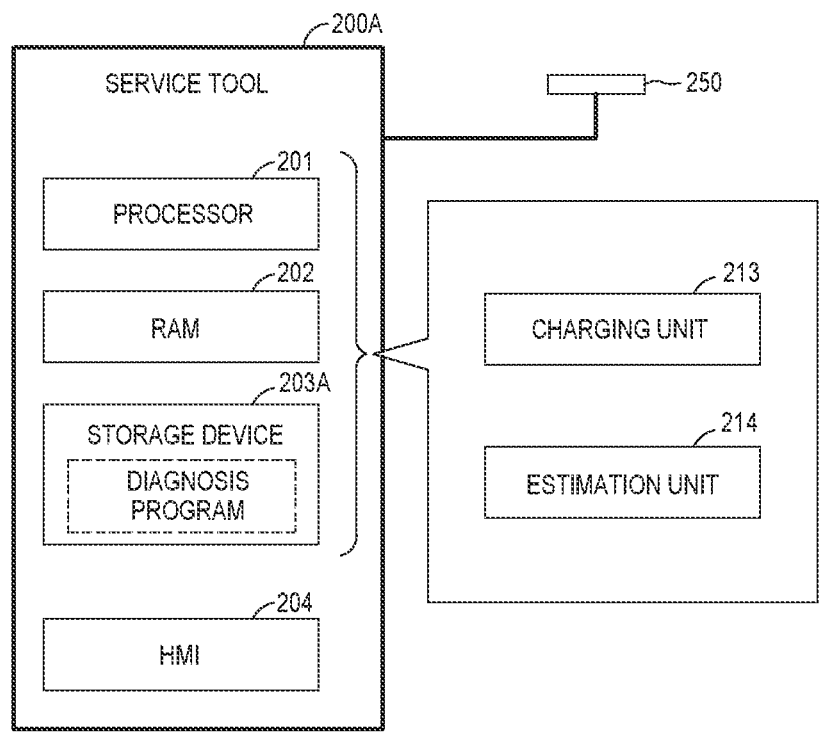
FIG. 10 is a diagram illustrating a modified example of a service tool illustrated in FIG. 2.

FIG. 10 is a flowchart illustrating a modified example of the service tool 200 illustrated in FIG. 2. With reference to FIG. 10, a service tool 200A includes a charging unit 213 and an estimation unit 214. The charging unit 213 and the estimation unit 214 in the service tool 200A are embodied by a processor 201 and a diagnosis program stored in a storage device 203A. The charging unit 213 is configured to charge all the cells included in the assembled battery, measure the voltage of each cell during the charging, and end the charging at a predetermined charging end timing (hereinafter, referred to as "$V_{end2}$"). The estimation unit 214 is configured to estimate the deterioration degree of the assembled battery using voltage data indicating a transition of a voltage of at least one cell included in the assembled battery from the charging start voltage to $V_{end2}$. The charging unit 213 is configured to, when a voltage of any cell (the target cell) included in the assembled battery reaches $V_{end2}$, decide the charging end timing using voltage data of the cell (the target cell).

Figure 11:
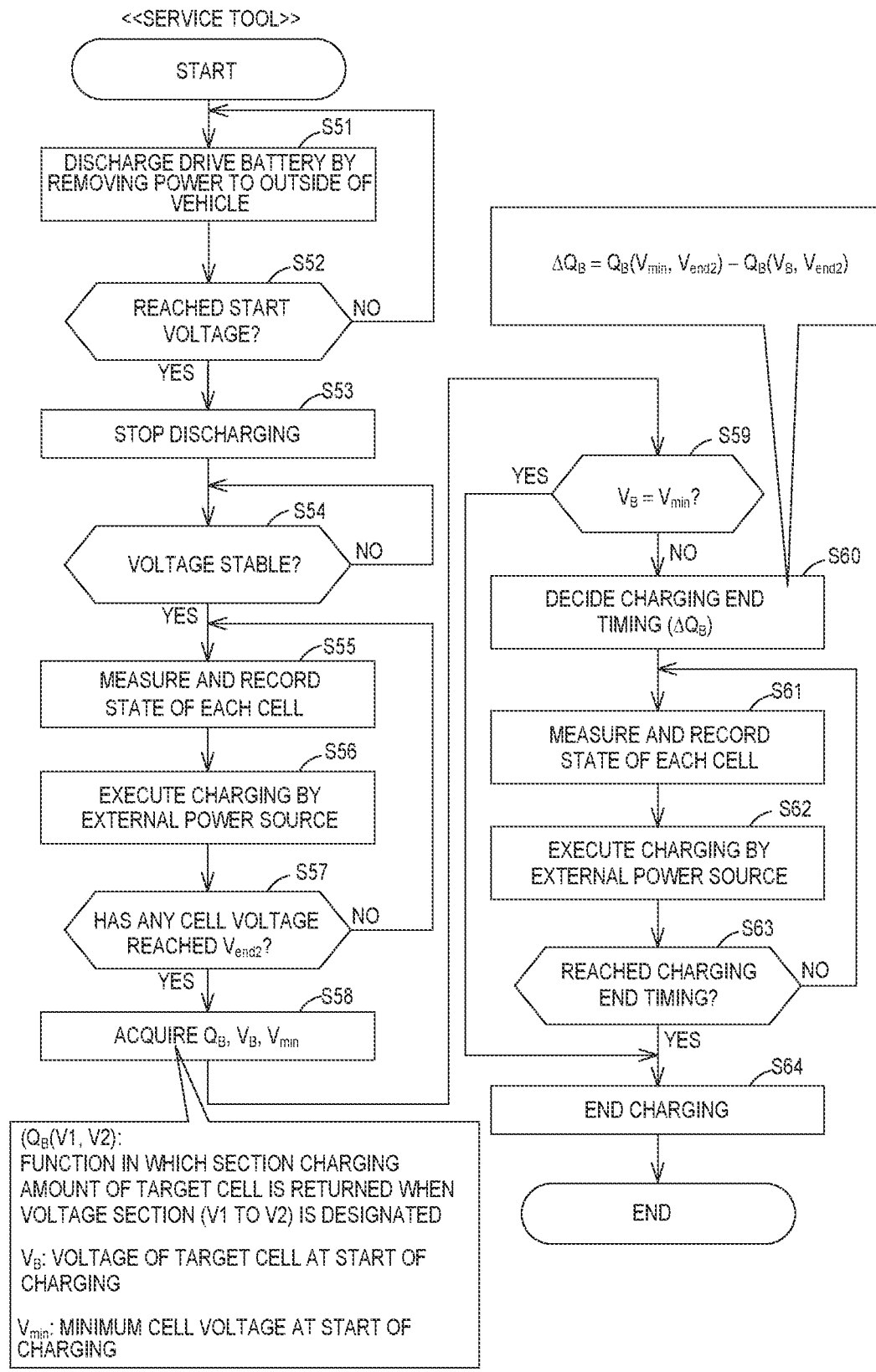
FIG. 11 is a flowchart illustrating a modified example 2 of the processes illustrated in FIG. 3.

FIG. 11 is a flowchart illustrating a modified example 2 of the processes illustrated in FIG. 3. Each step illustrated in FIG. 11 is executed by the charging unit 213 of the service tool 200A. With reference to FIG. 11, in S51, the service tool 200A discharges the assembled battery by a function of V2H of the BEV. In other words, the service tool 200A discharges the assembled battery mounted on the BEV by removing power therefrom to the outside of the vehicle. The power of the assembled battery may be consumed by a power load outside the vehicle, or may be accumulated in a power accumulation device outside the vehicle. However, the discharging method is not limited to V2H, and the power of the assembled battery may be consumed by a power load mounted on the BEV.

In S52, the service tool 200A determines whether the voltages of all the cells included in the assembled battery are a predetermined charging start voltage or lower. The charging start voltage may be the discharging lower limit voltage or may be a voltage slightly higher than the discharging lower limit voltage. When the voltages of all the cells fall below the charging start voltage due to the discharging of S51 (YES in S52), in S53, the service tool 200A stops the discharging. Thereafter, the BEV is connected to electric vehicle supply equipment (EVSE). Then, in S54, the service tool 200A determines whether the voltages of all the cells included in the assembled battery are stable. When the voltage of each cell included in the assembled battery is stable (YES in S54), the process proceeds to S55.

In S55, the service tool 200A measures a state (a voltage, current, and a temperature) of each cell included in the assembled battery, and records a measurement result in the storage device 203A. Subsequently in S56, the service tool 200A charges the assembled battery by the EVSE (an external power source). The assembled battery is charged (in more detail, charged by the external power source from the outside) while it is mounted on the BEV. The service tool 200A may execute a rapid charging of the assembled battery using a rapid charger as the EVSE. In S57, the service tool 200A determines whether a voltage of any cell (the target cell) included in the assembled battery has reached a predetermined $V_{end2}$. $V_{end2}$ may be a cell voltage indicating that the cell is in a fully charged state, or may be a voltage slightly lower than the cell voltage in the fully charged state.

When a voltage of any cell included in the assembled battery reaches $V_{end2}$ (YES in S57), in S58, the service tool 200A acquires a voltage (hereinafter, referred to as "$V_B$") of the target cell at the start of the charging, a minimum cell voltage (hereinafter, referred to as "$V_{min}$"), and a function (hereinafter, referred to as "$Q_B$") indicating a charging characteristic of the target cell, using the data acquired in S55. From among the voltages (measured in S55) of the cells included in the assembled battery at the start of the charging, the lowest voltage is $V_{min}$, and the voltage of the target cell is $V_B$. In other words, $V_B$ is $V_{min}$ or higher. The service tool 200A can derive $Q_B$ using the voltage data (measured in S55) indicating the transition of the voltage of the target cell from $V_B$ to $V_{end2}$. $Q_B$ may be specified using the least squares method.

Subsequently in S59, the service tool 200A determines whether $V_B$ corresponds to $V_{min}$. Then, when $V_B$ corresponds to $V_{min}$ (YES in S59), in S64, the service tool 200A ends the charging of the assembled battery. On the other hand, when $V_B$ does not correspond to $V_{min}$ (NO in S59), in S60, the service tool 200A decides the charging end timing using $Q_B$, $V_B$, and $V_{min}$.

Figure 12:
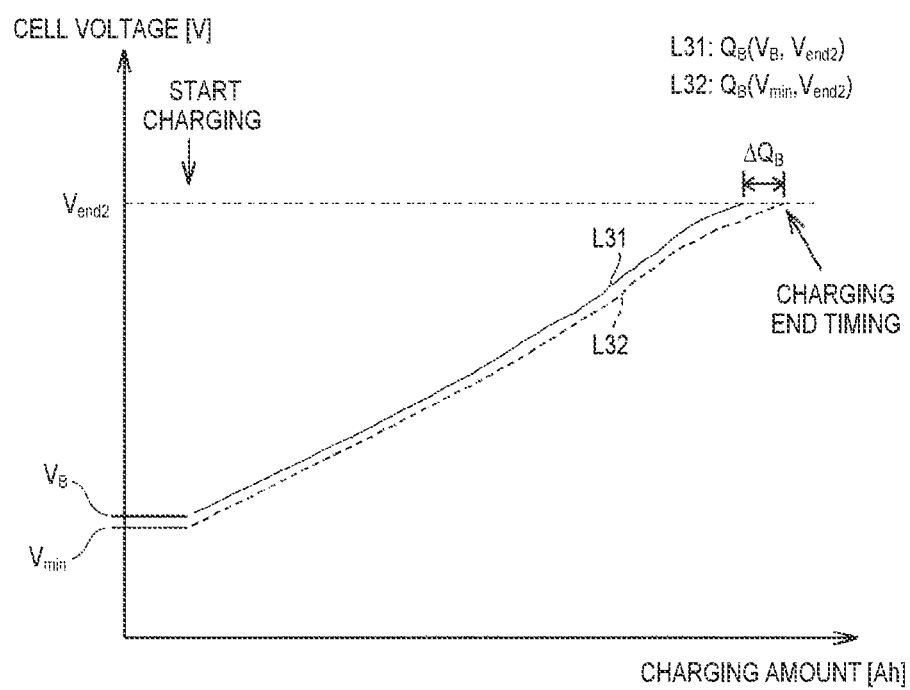
FIG. 12 is a graph for describing a method of deciding a charging end timing.

FIG. 12 is a graph for describing a method of deciding the charging end timing. A line L31 in FIG. 12 illustrates a transition of a charging amount of the target cell in a voltage section from $V_B$ to $V_{end2}$. A line L32 in FIG. 12 illustrates a transition of the voltage of the target cell when assuming that the charging of the target cell is started from $V_{min}$.

With reference to FIG. 12, in S59 of FIG. 11, when it is determined that $V_B$ corresponds to $V_{min}$, the line L31 matches the line L32 and $\Delta Q_B$ becomes zero. For this reason, the service tool 200A decides that the timing at which the voltage of the target cell has reached $V_{end2}$ is the charging end timing. As such, the charging of the assembled battery is ended immediately after the voltage of the target cell has reached $V_{end2}$ (S64 of FIG. 11).

On the other hand, in S59 of FIG. 11, upon determining that $V_B$ does not correspond to $V_{min}$, subsequently in S60, the service tool 200A sets, as $\Delta Q_B$, a value obtained by subtracting the section charging amount (the charging amount from $V_B$ to $V_{end2}$) of the target cell, obtained by inputting $V_B$ and $V_{end2}$ to $Q_B$, from the section charging amount (the charging amount from $V_{min}$ to $V_{end2}$) of the target cell, obtained by inputting $V_{min}$ and $V_{end2}$ to $Q_B$.

With reference to FIG. 11 again, when the charging end timing is decided in S60, processes of S61 and S62 are executed. In S61 and S62, the same processes as those of S55 and S56 described above are executed, respectively. By the process of S62, the charging of the assembled battery is continued. In S63, the service tool 200A determines whether the charging end timing has arrived. When the charging end timing arrives (YES in S63), in S64, the service tool 200A ends the charging of the assembled battery.

By the above-described processes illustrated in FIG. 11, the data indicating the state (particularly, the deterioration degree) of the assembled battery is recorded in the storage device 203A of the service tool 200A. The service tool 200A estimates the deterioration degree of the assembled battery using the data of the assembled battery recorded in S55 and S61 of FIG. 11.

Figure 13:
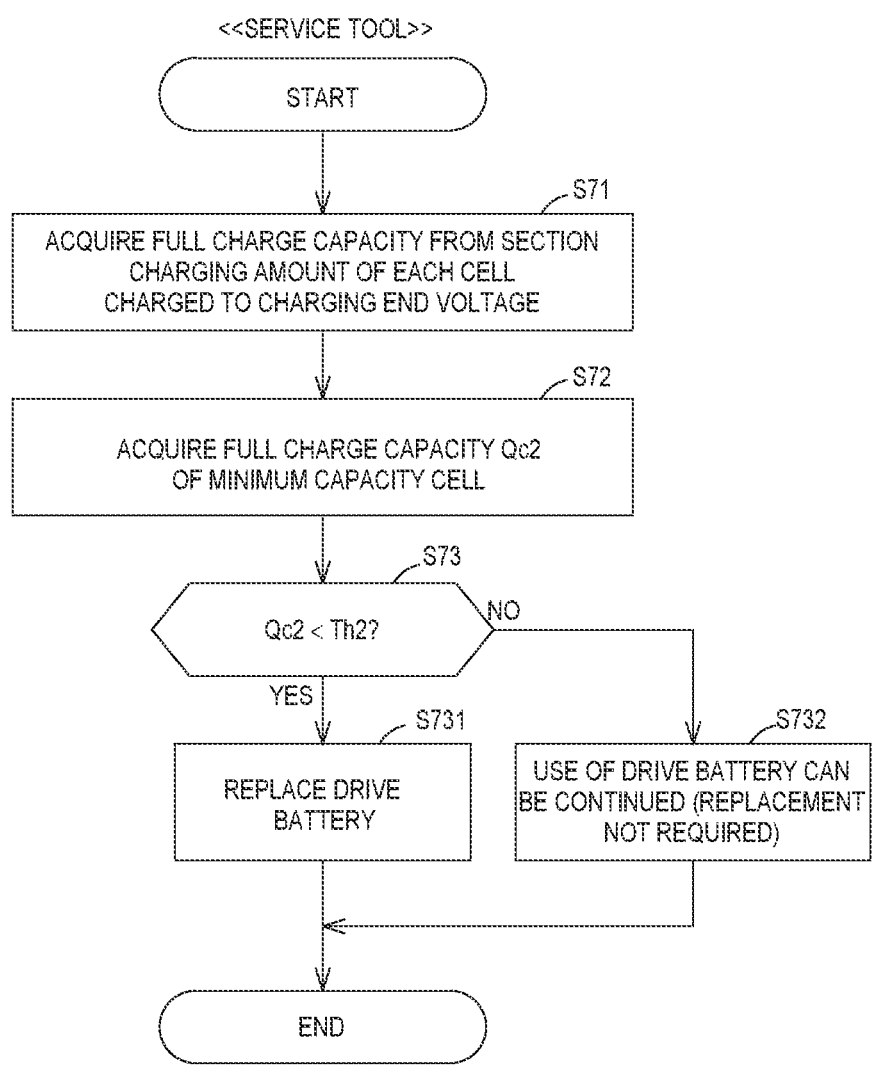
FIG. 13 is a flowchart illustrating a modified example of the processes illustrated in FIG. 7.

FIG. 13 is a flowchart illustrating a modified example of the processes illustrated in FIG. 7. Each step illustrated in FIG. 13 is executed by the estimation unit 214 of the service tool 200A. In the processes illustrated in FIG. 13, the deterioration degree of the assembled battery is estimated basically in a mode equivalent to that of the diagnosis of the deterioration (see FIG. 7) due to the discharging described above. In other words, by the processes of S71 and S72, the full charge capacity (Qc2) of the minimum capacity cell in the assembled battery is acquired. In S73, the service tool 200A determines whether Qc2 is lower than a predetermined reference value (Th2). Th2 is a reference value corresponding to Th1 (see FIG. 7). When Qc2 is lower than Th2 (YES in S73), the drive battery (the assembled battery) of the BEV is replaced (S731), and when Qc2 is Th2 or higher (NO in S73), the use of the assembled battery in the BEV is continued (S732). As such, with the deterioration diagnosis method of the assembled battery according to the modified example, it is possible to estimate the deterioration degree of the assembled battery from the transition of the voltage during the charging. With the above-described deterioration diagnosis method due to the charging, it is possible to diagnose a large-capacity assembled battery (that is, an assembled battery having a capacity of 10 kWh or larger) with sufficient throughput.

Figure 14:
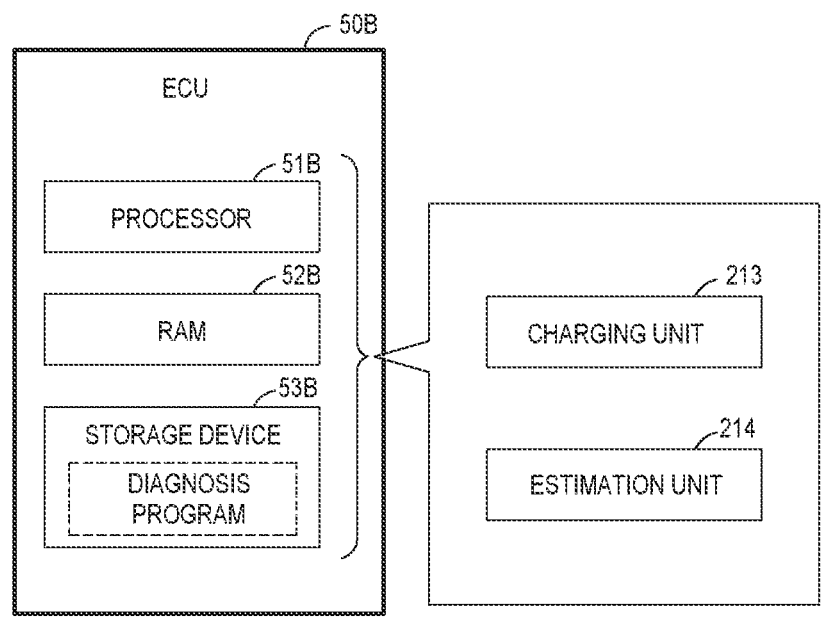
FIG. 14 is a diagram illustrating a vehicle control device having a charging unit and an estimation unit, illustrated in FIG. 10, mounted thereon.

Various modifications made for the diagnosis of the deterioration due to the discharging (for example, the modifications illustrated in FIGS. 8 and 9) may be executed for the diagnosis of the deterioration due to the charging. For example, functions of the above-described charging unit 213 and estimation unit 214 (see FIG. 10) may be implemented in the vehicle (for example, an xEV). FIG. 14 is a diagram illustrating an ECU 50B having the charging unit 213 and the estimation unit 214, illustrated in FIG. 10, mounted thereon. With reference to FIG. 14, the ECU 50B mounted on the vehicle (for example, a BEV or a PHEV) includes a processor 51B, a RAM 52B, and a storage device 53B. In the ECU 50B, the charging unit 213 and the estimation unit 214 are embodied by the processor 51B and a program executed by the processor 51B. The service tool or the ECU of the vehicle may be configured to selectively execute the diagnosis of the deterioration due to the discharging (for example, the processes illustrated in FIGS. 3 and 7) and the diagnosis of the deterioration due to the charging (for example, the processes illustrated in FIGS. 11 and 13). For example, when the full charge capacity of the assembled battery to be diagnosed in the initial state is a predetermined value or higher, the diagnosis of the deterioration due to the charging may be executed, and when the full charge capacity of the assembled battery to be diagnosed in the initial state is lower than the predetermined value, the diagnosis of the deterioration due to the discharging may be executed.

Figure 15:
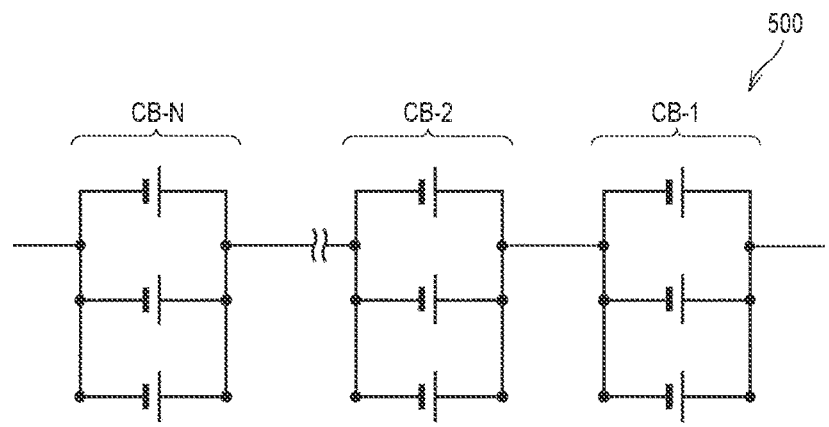
FIG. 15 is a diagram illustrating a modified example of the assembled battery illustrated in FIG. 2.

It is not essential that all the cells are connected in series in the assembled battery of which the deterioration is diagnosed by any of the above-described methods (see FIG. 2). The structure of the assembled battery of which the deterioration is diagnosed is arbitrary. FIG. 15 is a diagram illustrating a modified example of the assembled battery illustrated in FIG. 2. For example, an assembled battery 500 illustrated in FIG. 15 may be a target of the deterioration diagnosis. The assembled battery 500 includes N parallel cell blocks (that is, parallel cell blocks CB-1 to CB-N). Each of the parallel cell blocks CB-1 to CB-N includes a plurality of cells connected in parallel. The number of cells connected in parallel in each parallel cell block is arbitrary, but in the example illustrated in FIG. 15, it is three. The parallel cell blocks CB-1 to CB-N are connected in series via a power line.

The embodiment disclosed herein needs to be considered as illustrative in all points and not restrictive. The scope of the present disclosure is shown not by the above description of the embodiments but by the claims, and is intended to include meanings equivalent to the claims and all modifications within the scope thereof.

What is claimed is:
1. A deterioration diagnosis apparatus of an assembled battery, the deterioration diagnosis apparatus comprising at least one processor configured to:
   determine whether voltages of each of a plurality of cells included in the assembled battery have become a predetermined start voltage or higher;
   upon determination that the voltages of each of the plurality of cells included in the assembled battery have become the predetermined start voltage or higher, measure the voltages of each of the plurality of cells included in the assembled battery and acquire a maximum cell voltage that is a highest voltage among the plurality of cells;
   execute discharging of each of the plurality of cells included in the assembled battery;
   determine whether a voltage of any cell included in the assembled battery has reached a predetermined end voltage;
   determine a target cell of which a voltage reaches the predetermined end voltage earliest during the discharging among the plurality of cells;
   determine whether a voltage of the target cell at a start of the discharging is equal to the maximum cell voltage;
   upon determination that the voltage of the target cell at the start of the discharging is equal to the maximum cell voltage, end the discharging immediately after the voltage of the target cell reaches the predetermined end voltage;
   upon determination that the voltage of the target cell at the start of the discharging is not equal to the maximum cell voltage:
      calculate a first discharging amount that is a discharging amount of the cell from the voltage of the target cell at the start of the discharging to the predetermined end voltage;
      calculate a second discharging amount that is a discharging amount of the cell from the maximum cell voltage to the predetermined end voltage;
      calculate a third discharging amount that is a difference between the first discharging amount and the second discharging amount; and
      in a case where a discharging amount of the target cell, from the predetermined end voltage, exceeds the third discharging amount, stop discharging of the plurality of cells.

2. The deterioration diagnosis apparatus according to claim 1, wherein the predetermined end voltage is set based on a discharging lower limit voltage common to the cells.

3. The deterioration diagnosis apparatus according to claim 1, wherein:
   all the cells included in the assembled battery are connected in series; and
   the at least one processor is configured to maintain a current value of each of the cells during the discharging.

4. The deterioration diagnosis apparatus according to claim 1, wherein:
   the assembled battery is configured to supply power to a power load mounted on a vehicle; and
   the at least one processor is configured to execute the discharging by controlling the power load.

5. A deterioration diagnosis apparatus of an assembled battery, the deterioration diagnosis apparatus comprising at least one processor configured to:
   determine whether voltages of each of a plurality of cells included in the assembled battery have become a predetermined start voltage or higher;
   upon determination that the voltages of each of the plurality of cells included in the assembled battery have become the predetermined start voltage or higher, measure the voltages of each of the plurality of cells included in the assembled battery and acquire a maximum cell voltage that is a highest voltage among the plurality of cells;
   execute charging of each of the plurality of cells included in the assembled battery;
   determine whether a voltage of any cell included in the assembled battery has reached a predetermined end voltage;

determine a target cell of which a voltage reaches the predetermined end voltage earliest during the discharging among the plurality of cells;

determine whether a voltage of the target cell at a start of the charging is equal to the maximum cell voltage;

upon determination that the voltage of the target cell at the start of the charging is equal to the maximum cell voltage, end the charging immediately after the voltage of the target cell reaches the predetermined end voltage;

upon determination that the voltage of the target cell at the start of the charging is not equal to the maximum cell voltage:

calculate a first charging amount that is a charging amount of the cell from the voltage of the target cell at the start of the charging to the predetermined end voltage;

calculate a second charging amount that is a charging amount of the cell from the maximum cell voltage to the predetermined end voltage;

calculate a third charging amount that is a difference between the first charging amount and the second charging amount; and in a case where a charging amount of the target cell, from the predetermined end voltage, exceeds the third charging amount, stop discharging of the plurality of cells.

6. A deterioration diagnosis method of an assembled battery, the deterioration diagnosis method comprising:

determining whether voltages of each of a plurality of cells included in the assembled battery have become a predetermined start voltage or higher;

upon determination that the voltages of each of the plurality of cells included in the assembled battery have become the predetermined start voltage or higher, measuring the voltages of each of the plurality of cells included in the assembled battery and acquiring a maximum cell voltage that is a highest voltage among the plurality of cells;

executing discharging of each of the plurality of cells included in the assembled battery;

determining whether a voltage of any cell included in the assembled battery has reached a predetermined end voltage;

determining a target cell of which a voltage reaches the predetermined end voltage earliest during the discharging among the plurality of cells;

determining whether a voltage of the target cell at a start of the discharging is equal to the maximum cell voltage;

upon determination that the voltage of the target cell at the start of the discharging is equal to the maximum cell voltage, ending the discharging immediately after the voltage of the target cell reaches the predetermined end voltage;

upon determination that the voltage of the target cell at the start of the discharging is not equal to the maximum cell voltage:

calculating a first discharging amount that is a discharging amount of the cell from the voltage of the target cell at the start of the discharging to the predetermined end voltage;

calculating a second discharging amount that is a discharging amount of the cell from the maximum cell voltage to the predetermined end voltage;

calculating a third discharging amount that is a difference between the first discharging amount and the second discharging amount; and in a case where a discharging amount of the target cell, from the predetermined end voltage, exceeds the third discharging amount, stopping the discharging of the plurality of cells.

7. The deterioration diagnosis method according to claim 6, wherein:

the discharging is executed while the assembled battery is mounted on a vehicle; and a full charge capacity of the assembled battery in an initial state is 5 kWh or smaller.

8. A deterioration diagnosis method of an assembled battery, the deterioration diagnosis method comprising:

determining whether voltages of each of a plurality of cells included in the assembled battery have become a predetermined start voltage or higher;

upon determination that the voltages of each of the plurality of cells included in the assembled battery have become the predetermined start voltage or higher, measuring the voltages of each of the plurality of cells included in the assembled battery and acquiring a maximum cell voltage that is a highest voltage among the plurality of cells;

executing charging of each of the plurality of cells included in the assembled battery;

determining whether a voltage of any cell included in the assembled battery has reached a predetermined end voltage;

determining a target cell of which a voltage reaches the predetermined end voltage earliest during the discharging among the plurality of cells;

determining whether a voltage of the target cell at a start of the charging is equal to the maximum cell voltage;

upon determination that the voltage of the target cell at the start of the charging is equal to the maximum cell voltage, ending the charging immediately after the voltage of the target cell reaches the predetermined end voltage;

upon determination that the voltage of the target cell at the start of the charging is not equal to the maximum cell voltage:

calculating a first charging amount that is a charging amount of the cell from the voltage of the target cell at the start of the charging to the predetermined end voltage;

calculating a second charging amount that is a charging amount of the cell from the maximum cell voltage to the predetermined end voltage;

calculating a third charging amount that is a difference between the first charging amount and the second charging amount; and in a case where a charging amount of the target cell, from the predetermined end voltage, exceeds the third charging amount, stopping the discharging of the plurality of cells.

9. The deterioration diagnosis method according to claim 8, wherein:

the charging is executed while the assembled battery is mounted on a vehicle; and a full charge capacity of the assembled battery in an initial state is 10 kWh or larger.

* * * * *